(12) United States Patent
Grace et al.

(10) Patent No.: US 7,645,483 B2
(45) Date of Patent: Jan. 12, 2010

(54) TWO-DIMENSIONAL APERTURE ARRAY FOR VAPOR DEPOSITION

(75) Inventors: Jeremy M. Grace, Penfield, NY (US); Michael Long, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 647 days.

(21) Appl. No.: 11/333,111

(22) Filed: Jan. 17, 2006

(65) Prior Publication Data

US 2007/0163497 A1 Jul. 19, 2007

(51) Int. Cl.
*C23C 16/00* (2006.01)
(52) U.S. Cl. .................................. 427/248.1; 118/715
(58) Field of Classification Search .................. None
See application file for complete search history.

(56) References Cited

U.S. PATENT DOCUMENTS

| | | | |
|---|---|---|---|
| 5,268,034 A | 12/1993 | Vukelic | |
| 5,286,519 A | 2/1994 | Vukelic | |
| 6,050,506 A | 4/2000 | Guo et al. | |
| 6,558,736 B2 | 5/2003 | Forrest et al. | |
| 6,565,661 B1 | 5/2003 | Nguyen | |
| 6,849,241 B2 | 2/2005 | Dauelsberg et al. | |
| 2003/0015140 A1* | 1/2003 | Van Slyke et al. | 118/723 VE |
| 2003/0209323 A1 | 11/2003 | Yokogaki | |
| 2004/0144321 A1* | 7/2004 | Grace et al. | 118/726 |
| 2004/0255857 A1* | 12/2004 | Chow et al. | 118/715 |
| 2005/0087131 A1 | 4/2005 | Shtein et al. | |
| 2005/0103265 A1 | 5/2005 | Gianoulakis et al. | |
| 2005/0106319 A1 | 5/2005 | Jurgensen et al. | |
| 2005/0255257 A1 | 11/2005 | Choi et al. | |

FOREIGN PATENT DOCUMENTS

| | | |
|---|---|---|
| EP | 1457582 | 9/2004 |
| JP | 11131238 | 5/1999 |
| JP | 2002 141290 | 5/2002 |

* cited by examiner

*Primary Examiner*—Timothy H Meeks
*Assistant Examiner*—Joseph Miller, Jr.
(74) *Attorney, Agent, or Firm*—Raymond L. Owens

(57) ABSTRACT

A method for forming a layer on a surface in making a device, including providing a distribution member for receiving vaporized material, the distribution member having one or more walls defining a polygonal two-dimensional pattern of apertures is formed in a wall, which deliver vaporized material in a molecular flow onto the surface; providing the polygonal two-dimensional pattern of apertures to have at least four vertices, with a first set of apertures disposed at the vertices, a second set of edge apertures disposed between the apertures of the first set and defining the edges of the polygonal two-dimensional pattern, and a third set of interior apertures disposed within the periphery of the polygonal two-dimensional pattern defined by the first and second sets of apertures; and dimensioning the apertures to obtain a desired flow rate.

20 Claims, 25 Drawing Sheets

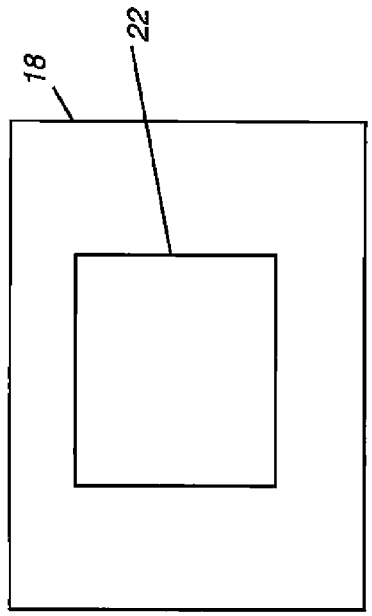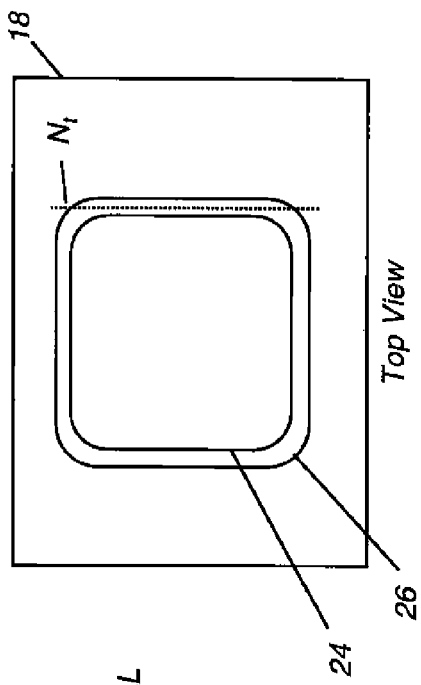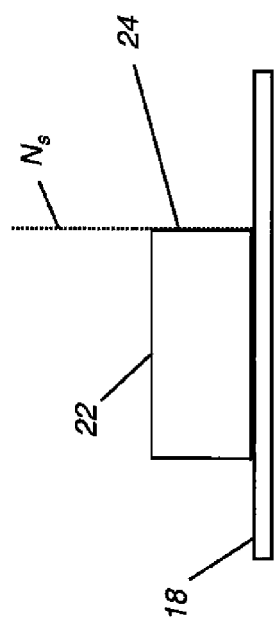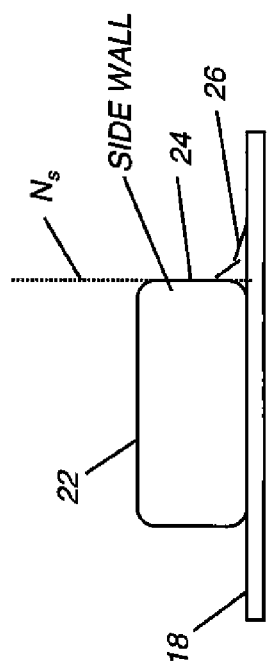
FIG. 2A  Side view
FIG. 2B  Top View
FIG. 2C  Side view
FIG. 2D  Top View

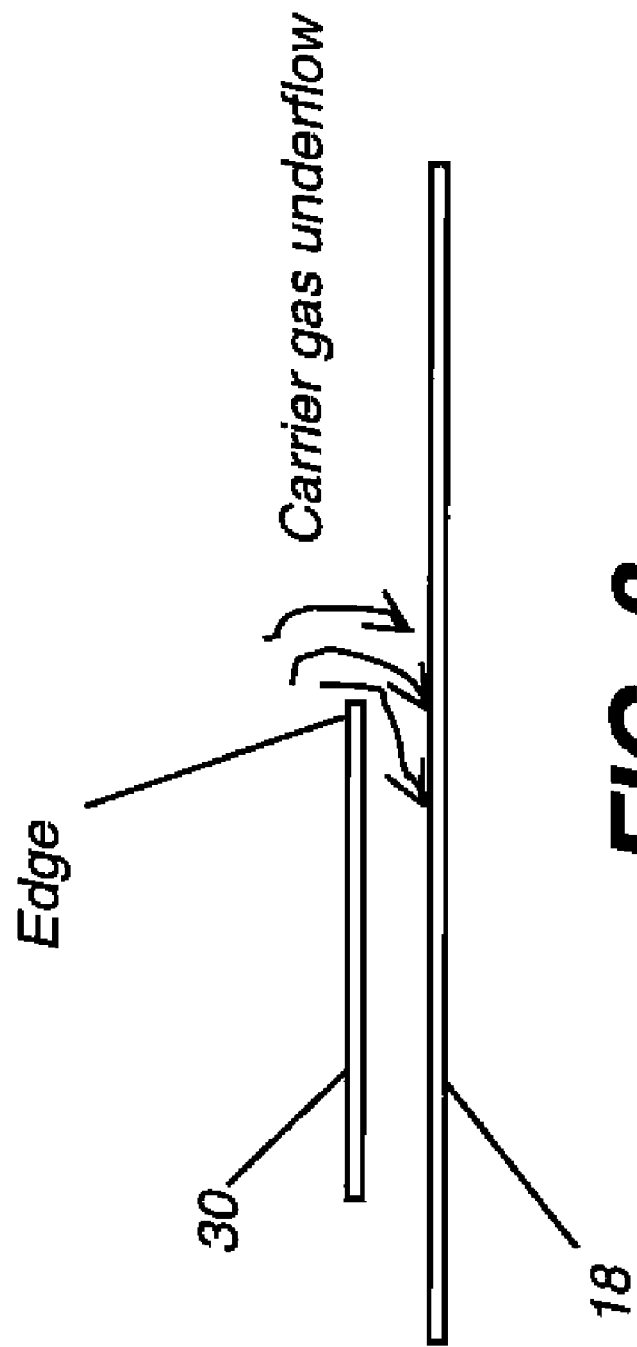

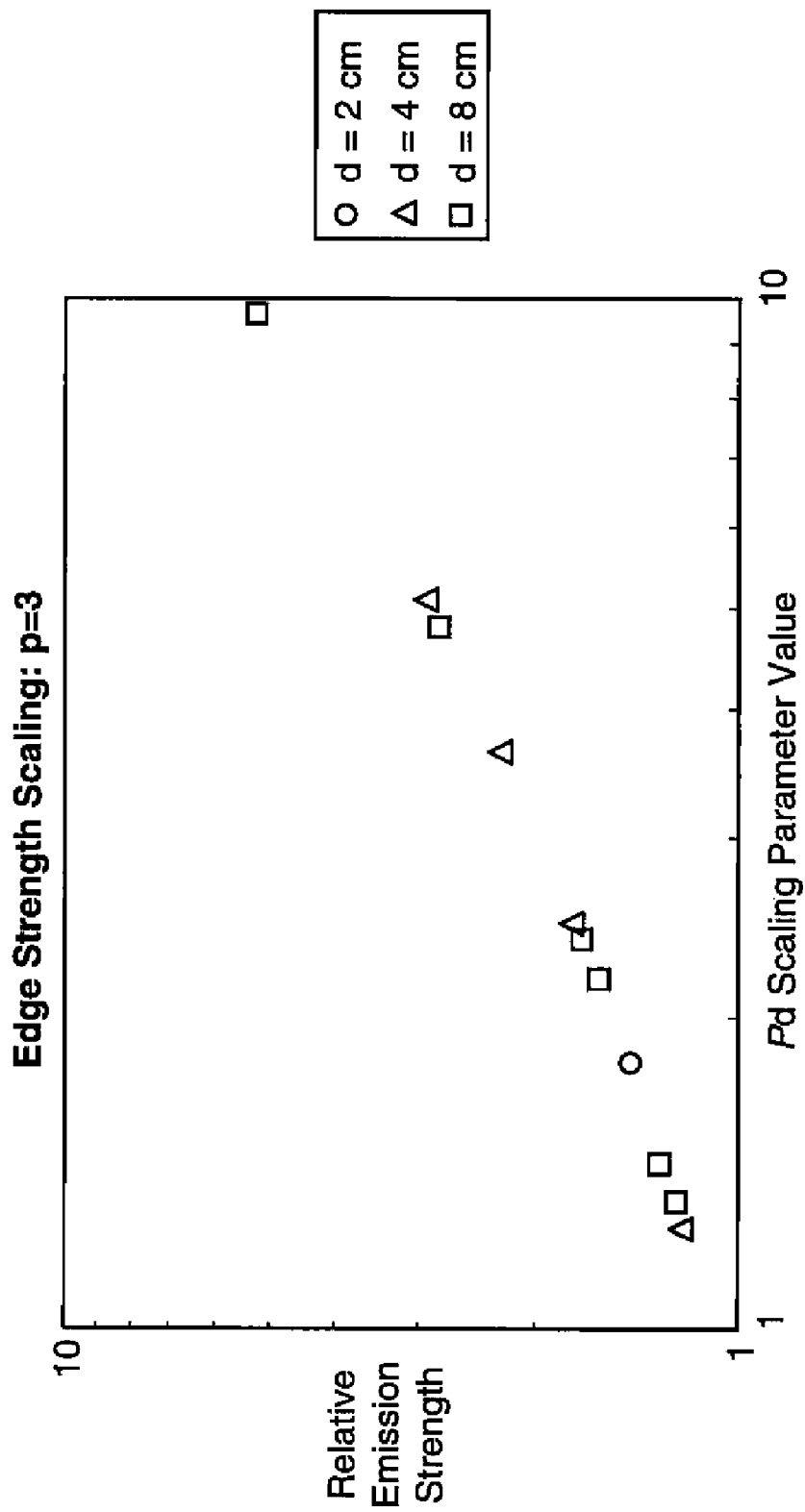

TWO-DIMENSIONAL APERTURE ARRAY FOR VAPOR DEPOSITION

FIELD OF THE INVENTION

This invention generally relates to deposition of thin films and more particularly relates to an apparatus and method for vapor deposition of a material in the molecular flow regime with optimized utilization and uniformity.

BACKGROUND OF THE INVENTION

The ongoing development of electronic and optical components has motivated the development of a variety of techniques for thin-film deposition of an ever-broadening array of materials. For semiconductor fabrication, for example, various methods of Chemical Vapor Deposition (CVD) have been developed for dielectric materials, metals and semiconductors. In CVD, a precursor material is delivered in vapor form and mixed with a carrier gas. This process gas mixture is then delivered to a substrate, either by expansion into a well-mixed process volume, or by localized distributed through a showerhead located near the substrate. The process pressures and geometries employed in CVD are generally selected to make use of the viscous flow regime. High substrate temperatures are often maintained in order to facilitate a chemical reaction at the surface, resulting in deposited material onto the heated substrate. Because the CVD apparatus employs viscous flow, the distribution of the process gases by the showerhead and related precursor delivery system conforms to principles of fluid mechanics in the viscous flow regime.

The need for fabrication of organic semiconductor elements and Organic Light Emitting Diode (OLED) displays places even more stringent requirements and restrictions on the vapor deposition process. For example, many organic semiconductor materials are not stable at high temperatures for a long period of time. Depending on their vapor pressure curves these materials may need to be heated significantly in order to entrain sufficient concentration of organic vapor in the carrier gas. Depending on their decomposition characteristics, however, such heating can present the risk of decomposition for such materials. In some cases, maintaining vapor sources at the temperatures required for vaporization for extended periods can cause appreciable decomposition of the organic material over long runs. A method similar to CVD and used for delivering organic vapors to substrates is called the Organic Vapor Phase Deposition (OVPD), as described in U.S. Pat. No. 6,558,736 entitled "Low Pressure Vapor Phase Deposition of Organic Thin Films" to Forrest et al., and has the basic arrangement shown in FIG. 1. A deposition apparatus 10 has a vaporization chamber 12 for vaporizing the organic material. The vaporized material is mixed with a carrier gas 14 and delivered to a showerhead 16 for deposition onto a substrate 18 in a deposition chamber 20.

Improved uniformity is of particular interest for improving thin film vapor deposition. Conventional physical vapor deposition methods (for example, thermal evaporation from small crucibles—so called "point sources"—or elongated crucibles) can achieve thin-film deposition uniform to within about +/−5% of desired thickness. It would be advantageous to improve this level of performance. Some improved methods claim deposition uniformity in the range of about +/−3%. However, there would be particular advantages in providing even better uniformity to within about +/−1%, particularly for devices where the layers are optically active and where thickness variations can cause variations in hue, light output, optical absorption, etc.

Another key area of interest relates to utilization efficiency. Conventional systems generally exhibit poor utilization, often wasting the majority of material. For example, large-area deposition from a limited number of point sources requires large throw distances (that is, source-substrate spacing) to achieve acceptable uniformity. In such cases, as little as 5% of the vaporized material condenses on the substrate, with the majority of the material condensing elsewhere in the deposition chamber. Careful design and set-up of planetary motion substrate holders can make better use of the vaporized material, but this approach is generally limited to batches of a large number of very small substrates, so as to ensure nearly constant radial distance from substrate surface to point source.

In attempting to improve deposition uniformity and utilization for both CVD and OVPD applications, one approach has been to improve the performance of the showerhead. In the case of thermal evaporation (thermal physical vapor deposition), elongated deposition sources have been used with relative motion of the substrate and elongated source perpendicular to the direction of elongation. These elongated sources have been sealed with lid structures having a plurality of apertures, the size and spacing of which can be adjusted to improve uniformity. A few examples of such attempts to improve uniformity and utilization are the following:

U.S. Pat. No. 6,050,506 entitled "Pattern of Apertures in a Showerhead for Chemical Vapor Deposition" to Gui et al. describes a perforation pattern for depositing metals from a CVD showerhead;

U.S. Pat. No. 6,849,241 entitled "Device and Method for Depositing One or More Layers on a Substrate" to Dauelsberg et al. describes an optimized orifice shape for vapor deposition from a showerhead;

U.S. Pat. No. 5,268,034 entitled "Fluid Dispersion Head" and U.S. Pat. No. 5,286,519 entitled "Fluid Dispersion Head for CVD Apparatus", both to Vukelic, disclose various showerhead perforation patterns for CVD devices;

U.S. Pat. No. 6,565,661 entitled "High Flow Conductance and High Thermal Conductance Showerhead System and Method" to Nguyen describes showerhead designs with variable hole size, pattern, and angular orientation;

U.S. Patent Application Publication No. 2005/0103265 entitled "Gas Distribution Showerhead Featuring Exhaust Apertures" by Gianoulakis et al. describes a showerhead design having both distribution and exhaust apertures in various arrangements;

U.S. Patent Application Publication No. 2005/0087131 entitled "Method and Apparatus for Depositing Material" by Shtein et al. describes forming a pattern on a surface using a collimated, carrier-supported gas jet to perform Organic Vapor Jet Printing;

Commonly assigned U.S. Patent Application Publication No. 2003/0168013 entitled "Elongated Thermal Physical Vapor Deposition Source with Plural Apertures for Making an Organic Light-Emitting Device" by Freeman et al. discloses a linear source for vapor deposition onto a moving substrate in which aperture size and spacing are varied to improve uniformity;

U.S. Patent Application Publication No. 2005/0106319 entitled "Process and Device for Depositing Thin Layers on a Substrate in a Process Chamber of Adjustable Height" by Jurgensen et al. discloses a showerhead used in a chamber that is of adjustable height, for different pressures, for example.

As these examples show, showerhead design is an important factor for achieving uniform deposition of materials for both CVD and OVPD systems, and aperture size and spacing are critical for uniformity in systems based on effusion (Freeman et al). Both CVD and OVPD systems operate in the viscous flow regime, forming a mixture of the vaporized material with an inert or benign carrier gas, then forcing this mixture through showerhead orifices, following the model established with earlier CVD systems. In the fluid dynamics model used for viscous flow, a showerhead is used to direct the vapor/carrier mixture toward the substrate surface. Because this method uses viscous flow, in order to arrive at the substrate surface, the CVD precursor material or OVPD vaporized organic material must then diffuse through a thin boundary layer above the substrate surface.

Another problem with CVD and OVPD systems relates to patterning precision when using shadow masks. Patterned features formed on the substrate surface often exhibit "pillowing" or bowing rather than having sharply defined edges. Referring to the side view of FIG. 2A and top view of FIG. 2B, the ideal shape of a surface feature 22 on substrate 18 would be achieved by having vertical sidewalls 24, parallel to a normal $N_s$ to the surface of substrate 18. However, in practice, as shown in the corresponding side and top views of FIGS. 2C and 2D, side walls 24 are not vertical, but are bowed, typically with a sloped section 26 extending outward, so that an imperfect approximation of straight sidewalls 24 is achieved. As shown in the side view of FIG. 3, vapor underflow causes some portion of material to slip underneath a mask 30, resulting in the sloped section 26 shown in FIG. 2C. This vapor underflow is an undesirable side effect of viscous flow. As a result of this imperfection, increased distances between surface features 22 must be maintained in order to provide distinct features. In component fabrication, this means that device resolution is limited as a result. Surface features 22 with more ideally sloped sidewalls 24, as shown in FIGS. 2A and 2 B, would allow tighter packing of components, reducing the area or "real estate" required for electronic components and thereby increasing the available resolution of a device.

In order to provide higher precision, a number of conventional thermal vapor deposition apparatuses employ a linear source, with orifices arranged along a line. Deposition onto a surface using this type of system requires some type of precision transport mechanism, either to translate the substrate past the showerhead or to translate the showerhead across the substrate surface during deposition. For high coating uniformity, this type of apparatus requires a precision transport mechanism delivering a highly uniform flow of vaporized material.

Yet another drawback of CVD and OVPD apparatus and methods relates to surface temperatures of the substrate. In the classical silicon-based semiconductor model, it was required that the surface temperature of the substrate be very high during deposition, often in excess of 400° C. Hence, CVD systems that were developed for semiconductor fabrication were designed to elevate the temperature of the substrate and to maintain it at high temperatures during materials deposition.

With the advent of organic semiconductors and other organic electronic materials, and with the drive to fabricate devices on organic polymeric substrates, however, substrate temperature concerns are very different from those in the classical semiconductor industry, where the CVD approach has routinely been used to deposit inorganic dielectrics, metals, and semiconductors. Instead of elevated temperatures at the substrate, it is important to maintain the substrate at much lower temperatures when applying organic materials on organic substrates. Furthermore, high-resolution shadow masking (commonly employed to pattern organic electronic devices) requires minimal differential thermal expansion between mask material and substrate, thus further constraining the maximum allowable thermal load. For a vapor deposition process with a significant heat load, it is a requirement to cool the substrate. Deposition processes that operate in the viscous flow regime may cause significant substrate heating, owing to the thermal conductivity of the carrier gas or of the precursor or vaporized material, which transports heat from the exit surface of the heated gas delivery system (showerhead) to the substrate surface.

U.S. Patent Application Publication No. 2004/0255857 entitled "Thin-Film Deposition Evaporator" by Chow et al. discloses a system for depositing a thin-film layer that claims uniformity to within about 3% without any mention of carrier gas use. In order to achieve this level of uniformity, the Chow et al. '5857 disclosure suggests choosing an appropriate arrangement of exit aperture numbers, positions, and dimensions. However, although the Chow et al. '5857 disclosure shows or describes some possible arrangement of manifold apertures, there is no clear indication on how to properly dimension or distribute these apertures to maintain high levels of uniformity. Nor are there any guidelines given for scaling in order to adapt a given deposition system architecture for handling different substrate sizes.

Thus it can be seen that although conventional thermal physical vapor deposition, CVD, and OVPD apparatus and techniques have achieved some measure of success in forming thin-film components and features, there is considerable room for improvement, particularly for fabrication of OLED and related devices.

SUMMARY OF THE INVENTION

The present invention provides a method for forming a layer on a surface in making a device, comprising, (a) providing a distribution member for receiving vaporized material, the distribution member having one or more walls defining a chamber wherein a polygonal two-dimensional pattern of apertures is formed in a wall, which deliver vaporized material in a molecular flow onto the surface;

(b) providing the polygonal two-dimensional pattern of apertures to have at least four vertices, with a first set of apertures disposed at the vertices, a second set of edge apertures disposed between the apertures of the first set and defining the edges of the polygonal two-dimensional pattern, and a third set of interior apertures disposed within the periphery of the polygonal two-dimensional pattern defined by the first and second sets of apertures; and (c) dimensioning the first, second, and third set of apertures to obtain a greater flow rate per unit wall area from the first set of apertures than from the second and third set of apertures, and to obtain a greater flow rate per unit wall area from the second set of apertures than from the third set of apertures.

It is a feature of the present invention that it provides a method for deposition of organic vapor operating in the molecular flow regime rather than the viscous flow regime.

Among advantages of the present invention are the following:

(i) Improved thermal characteristics for depositing organic materials and deposition onto flexible substrates.

(ii) Vapor deposition in the molecular flow regime, without the requirement for a carrier gas and supporting apparatus for mixture of carrier gas with vaporized material.

(iii) Scalable vapor deposition capability from smaller substrate areas to large scale.

(iv) Usable with or without a transport mechanism. That is, the apparatus and method of the present invention can be used in a chamber where the substrate is held stationary, or can be used with a web-based fabrication apparatus.

(v) Achieves higher degree of uniformity materials utilization than is conventionally achieved.

(vi) Enables higher masking precision by eliminating carrier gas underflow behavior.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

Although the specification concludes with claims particularly pointing out and distinctly claiming the subject matter of the present invention, it is believed that the invention will be better understood from the following description when taken in conjunction with the accompanying drawings, wherein:

FIGS. 2A and 2B are side and top views, respectively, of the ideal shape for a feature formed using OVPD fabrication;

FIGS. 2C and 2D are side and top views, respectively, approximating the actual shape for a feature formed using OVPD fabrication;

FIG. 3 is a side view representing the effects of carrier gas underflow on sidewall formation;

FIG. 21B is a graph showing edge strength scaling with pitch times throw distance for a plume exponent of 3.

DETAILED DESCRIPTION OF THE INVENTION

The present description is directed in particular to elements forming part of, or cooperating more directly with, apparatus in accordance with the invention. It is to be understood that elements not specifically shown or described can take various forms well known to those skilled in the art.

By way of definition, as it relates to material deposition, "uniformity" is defined as one half the difference between maximum and minimum deposition rate on the substrate, divided by the average deposition rate on the substrate. In a deposition apparatus that emits from multiple apertures, "materials utilization" is defined as the average deposition rate on a substrate (in mass per unit area per unit time) multiplied by the substrate area and divided by the total emission strength (in mass per unit time) of all apertures.

By way of terminology, the description that follows generally uses the term "aperture" as equivalent to the term "orifice" that can be found in the literature on deposition apparatuses. In order to better understand the nature and scope of the present invention, it is first useful to emphasize some important distinctions between the approaches used in conventional CVD and OVPD practice and the approaches used in the present invention.

As is noted in the background section given above, conventional CVD and OVPD apparatus operate in the viscous flow regime. Flow regimes can be distinguished from one another using the Knudsen number (Kn) familiar to those skilled in fluid dynamics. Basically, the Knudsen number is a dimensionless parameter, a ratio that quantifies the relative amount of gas scattering. More precisely, the Knudsen number gives the ratio between the mean free path of gas molecules and a characteristic dimension of the geometry in which the gas travels. There are various regimes delineated by Knudsen number, as shown in FIG. 4.

Figure 1:
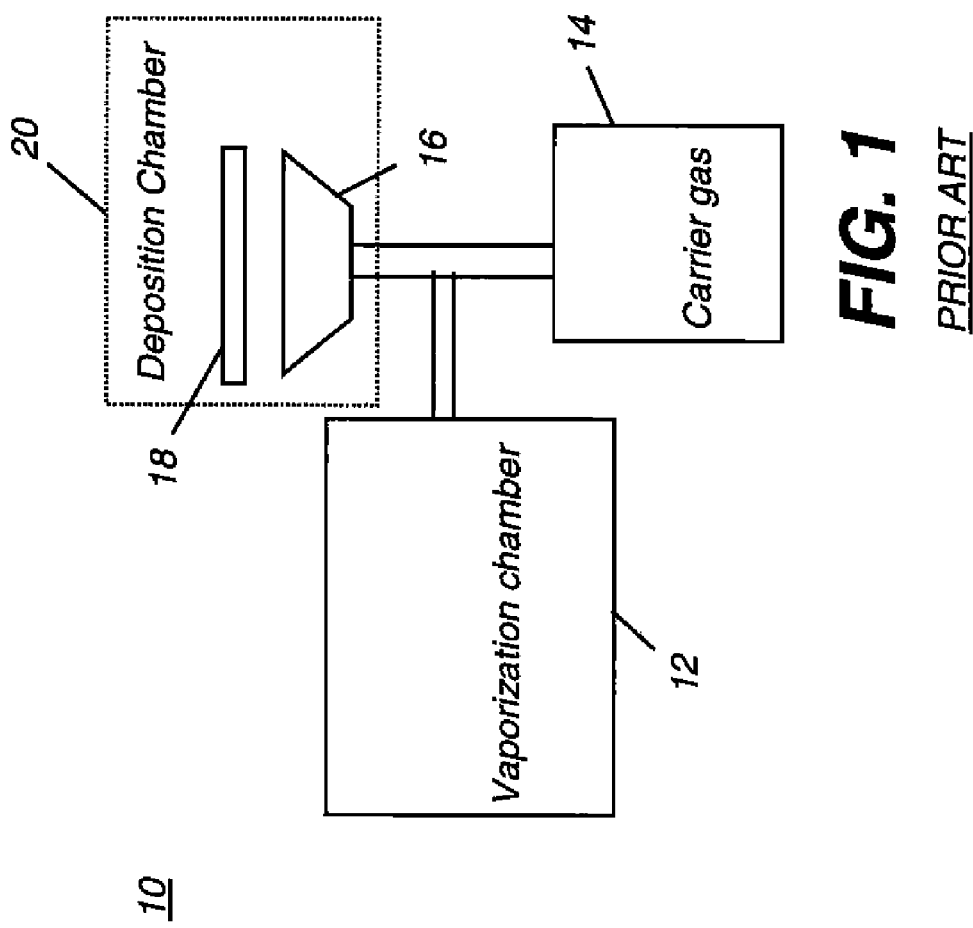
FIG. 1 is a block diagram showing key components of a conventional OVPD apparatus.
Figure 4:
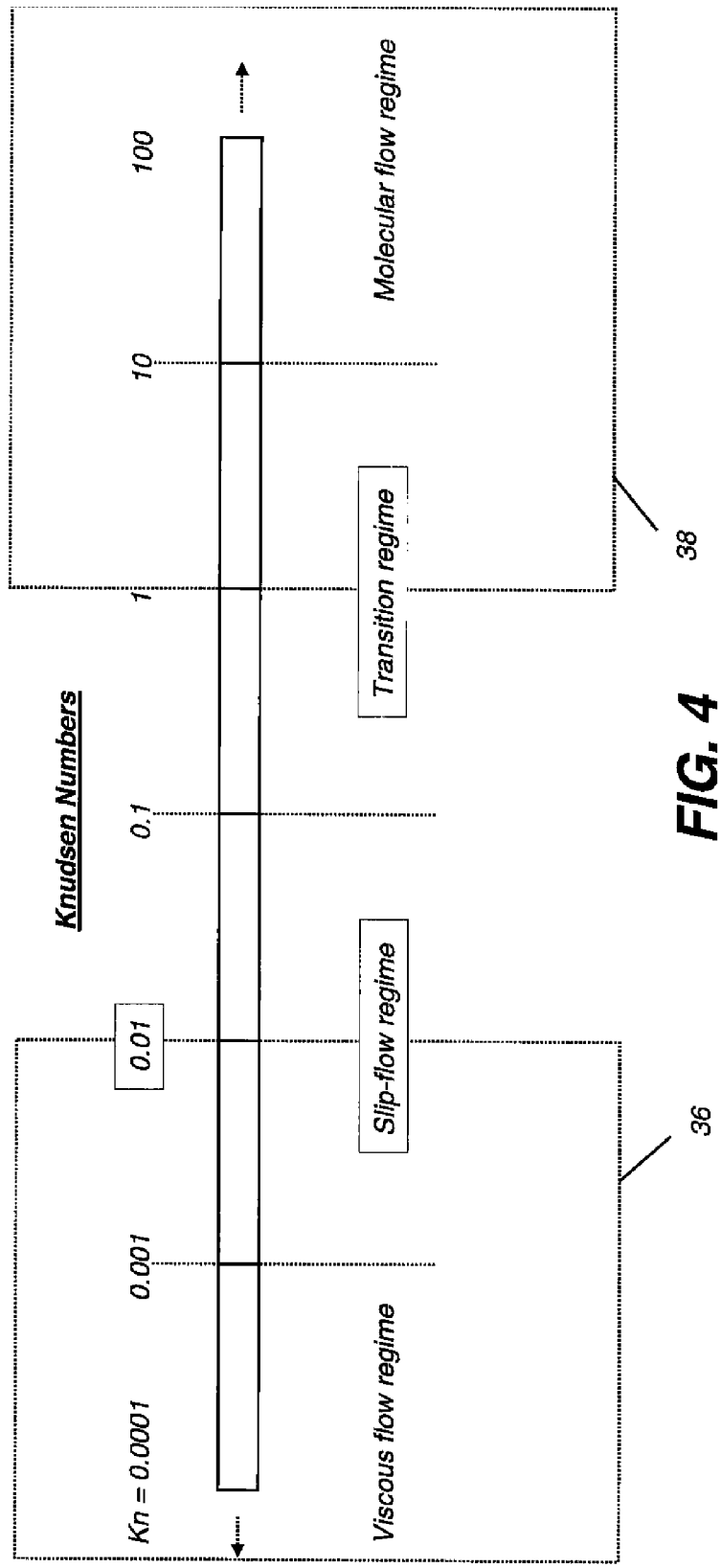
FIG. 4 is a chart showing the correspondence of Knudsen number ranges to fluid flow regimes, from viscous to molecular flow.

As FIG. 4 shows, Knudsen numbers less than about 0.01 can be considered to characterize a viscous flow regime 36, for which continuum fluid mechanics principles and behavior apply. Because differences in behavior are gradual, the viscous flow regime 36 can also be considered to include a portion of what is termed the Slip-flow regime. Conventional CVD systems and OVPD systems that use carrier gas operate within this regime, as has been noted in the background section. Because there is considerable gas scattering that occurs during CVD and OVPD processes, shadowing effects are mitigated, and conformal coatings (i.e. coating thickness profiles that follow the contours of the underlying substrate) can be obtained. Conventional CVD practice and teaching have been found to teach away from using deposition in a molecular flow regime 38, where Knudsen numbers are in excess of about 1. For example, U.S. Patent Application Publication No. 2003/0129810 entitled "Apparatus and Processes for the Mass Production of Photovoltaic Modules" by Barth et al. disparages the use of molecular flow regime conditions for vapor deposition because of reduced gas scattering and indicates that non-uniform deposition can result when molecular flow is employed. The gas scattering effect obtained with viscous flow, may improve the conformality of the coating to the substrate topography, but presents limitations on the ability to pattern using shadow masks, as discussed earlier. In contrast to this conventional teaching, as exhibited in the '9810 Barth et al. disclosure, the inventor has found that deposition in the molecular flow regime is actually well-suited to the use of shadow masks, with deposition uniformity governed by principles that resemble those of geometrical optics.

Figure 5:
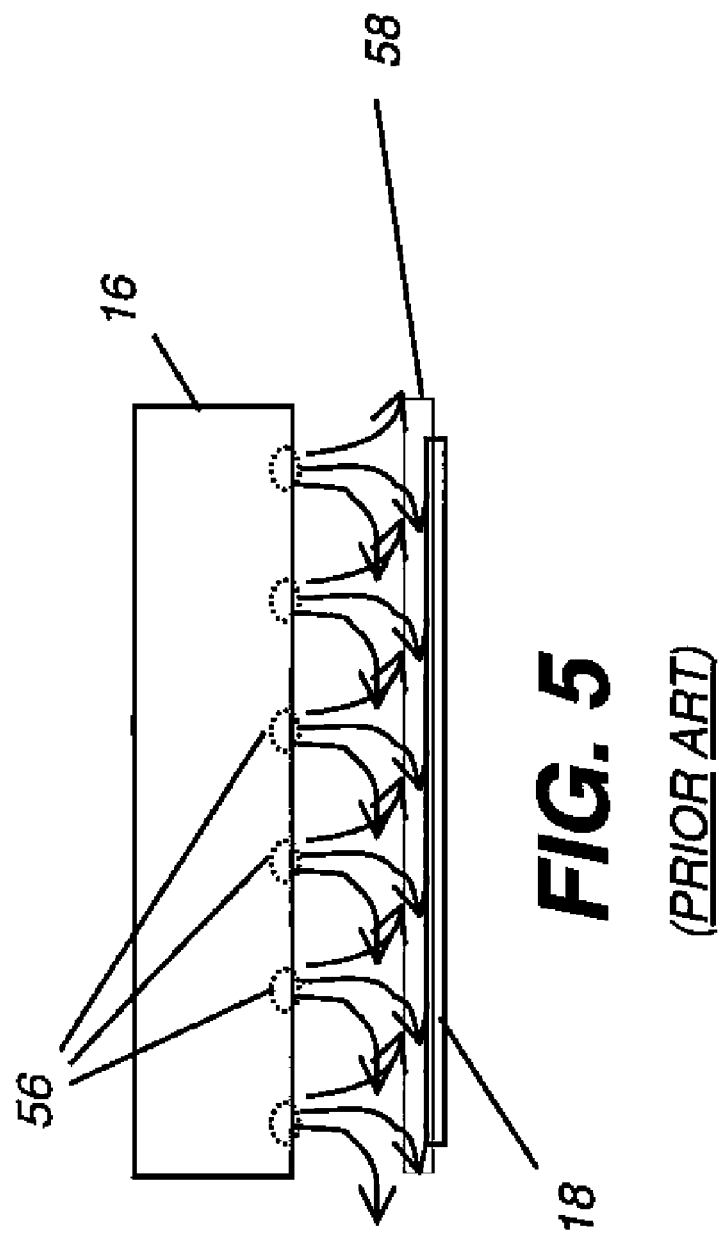
FIG. 5 is a side view of a conventional showerhead design using viscous flow.

Because viscous flow, with conformance to continuum fluid mechanics principles, is employed with conventional systems, the term "fluid dispersion head" or "showerhead" is aptly applied to the distribution component that provides a set of orifices for the evaporant/carrier gas mix in conventional CVD and OVPD apparatus. In CVD as represented in side view in FIG. 5, showerhead 16 forces the vapor/carrier process gas mixture from orifices 56 onto substrate 18. A boundary layer 58 results, complicating the distribution flow pattern. Characteristics of this boundary layer, the concentration of evaporant or precursor therein, and the consumption of material at the substrate surface must all be taken into account in order to produce a uniform film.

As was noted earlier in the background section, one notable problem resulting from viscous flow relates to thermal conductance. The vapor/carrier process gas mixture conducts a significant amount of heat onto substrate 18. For a hot-walled CVD apparatus using a heated process gas mixture, this conductance is a benefit, as was noted earlier in the background section. In contrast, however, for OVPD, heat conductance through this gas can raise the temperature of substrate 18 to well above acceptable levels. Hence, conventional OVPD apparatus often employ cooling mechanisms to draw heat away from substrate 18. This adds expense and complexity, since temperature can be difficult to control over an area, resulting in uneven distribution and other unwanted effects.

Contrary to established practice and teaching, the apparatus and method of the present invention depart from conventional CVD and OVPD models by performing vapor deposition in the molecular flow region 38. With molecular flow vapor deposition, a number of parameters change and some fluid mechanics principles and complexities no longer apply.

Figure 6:
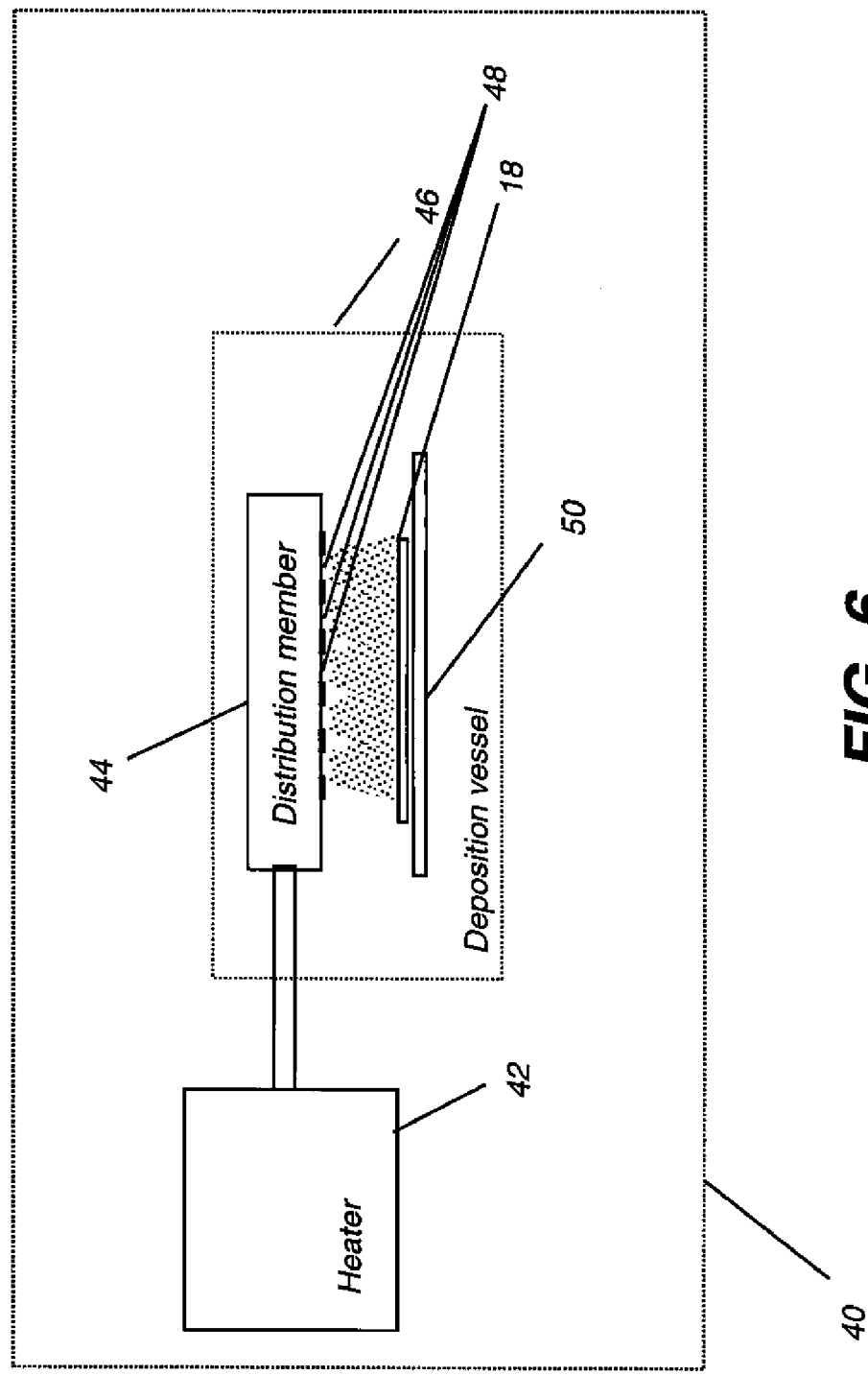
FIG. 6 is a block diagram showing key components of a vapor deposition apparatus according to the present invention.

Referring to FIG. 6, there is shown a block diagram of key components of a vapor deposition apparatus 40 according to the present invention. A heater 42, such as a flash evaporation heater for example, vaporizes the material to be deposited. Vapor pressure forces this material to a distribution member 44 in a deposition vessel 46. The vapor is delivered from a set of apertures 48 in a wall of distribution member 44, onto substrate 18, held by a substrate holder 50. No carrier gas is used. The heater 42 can also be located within the deposition chamber 20, directly behind or above the distribution member 44, adjacent to the distribution member 44, or in some other position such that it does not lie between the distribution member 44 and the substrate 18.

Figure 7:
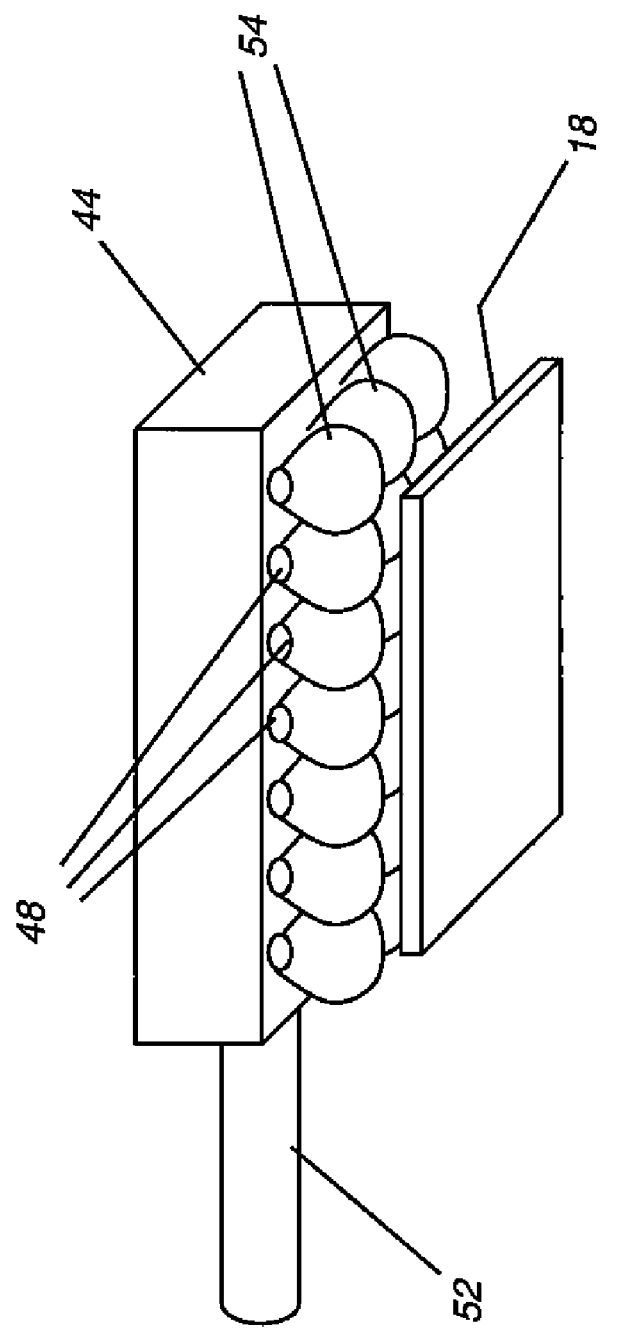
FIG. 7 is a perspective view showing a distribution member that provides a two-dimensional aperture array.

Referring to FIG. 7, there is shown a perspective of vapor distribution member 44 in operation. Vapor fed from a duct 52 is distributed from the set of apertures 48 and is emitted as a set of plumes 54. The duct 52 can be a single duct or a plurality of ducts. Furthermore, the duct or ducts 52 can be attached to any side of the distribution member 44 such that the duct or ducts 52 do not substantially intersect the vapor plumes 54.

Figure 8:
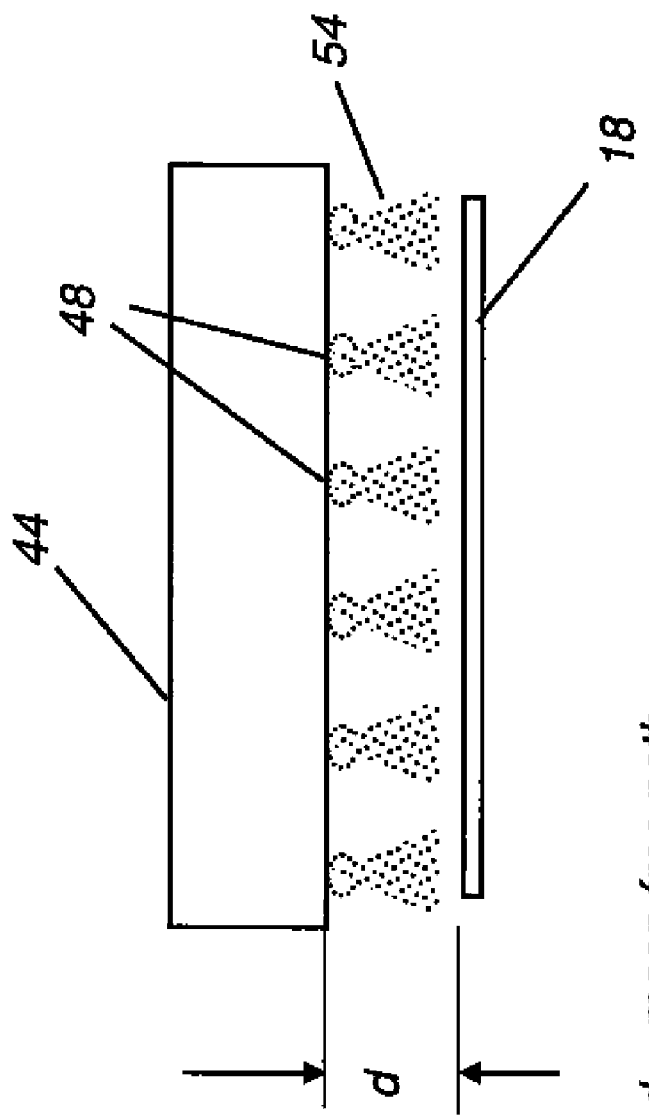
FIG. 8 is a side view of a distribution member according to the present invention for emitting vapor to be deposited using molecular flow.

FIG. 8 can be contrasted with FIG. 5 to compare the molecular flow for organic vapor deposition used in the present invention with conventional CVD and OVDP viscous flow. In FIG. 8, vapor, without a carrier gas, is provided as plumes 54 from the deposition apparatus of the present invention. Here, distribution member 44 provides apertures 48 that direct the vaporized material onto substrate 18. Unlike the CVD model shown in FIG. 5, heat conductance is greatly reduced in the molecular flow region. There are no boundary layer effects to complicate flow patterns. Molecular flow distribution follows a "line of sight" emission model, somewhat analogous to an optical model for light distribution from an array of point sources or apertures. A throw distance d is maintained between distribution member 44 and substrate 18, where d is shorter than the mean free path between vapor molecules. Plumes 54 have a characteristic shape, controlled by factors such as length and radius dimensions of aperture 48 and by the relative pressure conditions within deposition vessel 46 (FIG. 6).

Optimization of the Molecular Flow Organic Vapor Deposition Process

Figure 9:
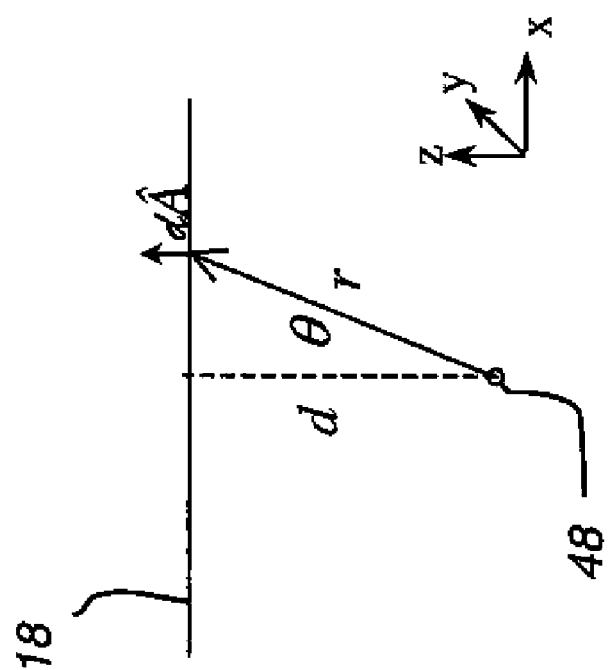
FIG. 9 is a perspective showing key parameters and dimensions of interest for vapor deposition of material from an individual aperture.

Referring to the diagram of FIG. 9, there are shown key dimensional and angular values of importance in determining the mass flux density $\Gamma$ and distribution on substrate 18. Aperture 48 acts ideally as a point source emitting unit mass per unit time into the half space in the positive z direction. The mass flux density $\Gamma$ drops inversely with the square of the radial distance from the source. The mass flux density $\Gamma$ effusing from a simple aperture of zero length in molecular flow exhibits an angular dependence given by $\cos(\theta)$, where $\theta$ is the angle between the normal to the plane of the aperture (i.e., the x-y plane in FIG. 9), and the radial vector to a point of observation. When aperture 48 is of non-zero depth and can be described as a short duct, the angular dependence of mass flux density $\Gamma$ is further enhanced in the z direction and can be approximated to vary as a higher power of $\cos(\theta)$.

Aperture 48 in FIG. 9 can be considered as a point source. For such a point source, located a distance d from a substrate having a differential surface area dA at a position relative to the source defined by the vector r, the mass per unit time per unit area that is being deposited at this position is given by:

$$\Gamma \cdot d\overline{A} = \frac{\cos^{p+1}(\theta)}{2\pi r^2} dA \quad (1)$$

A factor of $\cos(\theta)$ arises from the dot product of the surface normal dA and the radial vector r. Additional factors of $\cos(\theta)$ arise from a plume shape exponent p, which has a value of 1 when the point source is a zero length aperture. In practice, plume shape exponent p is greater than 1 for sources having non-zero ratio of length to aperture diameter. As is known to those skilled in the materials deposition art, the larger the length/diameter ratio for an emitting aperture, the larger is the value of plume shape exponent p.

Noting that the following applies:

$$\cos(\theta) = d/r, \quad (2)$$

Eq. 1 becomes:

$$\Gamma \cdot d\overline{A} = \frac{\cos^{p+3}(\theta)}{2\pi d^2} dA \quad (3)$$

For a given plume shape exponent p and a given source-substrate distance, or throw distance d, it is straightforward to compute the deposition rate profile over the substrate surface. Furthermore, for an array of point sources depositing onto a substrate, the individual deposition rate profiles from each point source can be superposed with one another to obtain the total deposition rate profile over the deposition surface.

Figure 10:
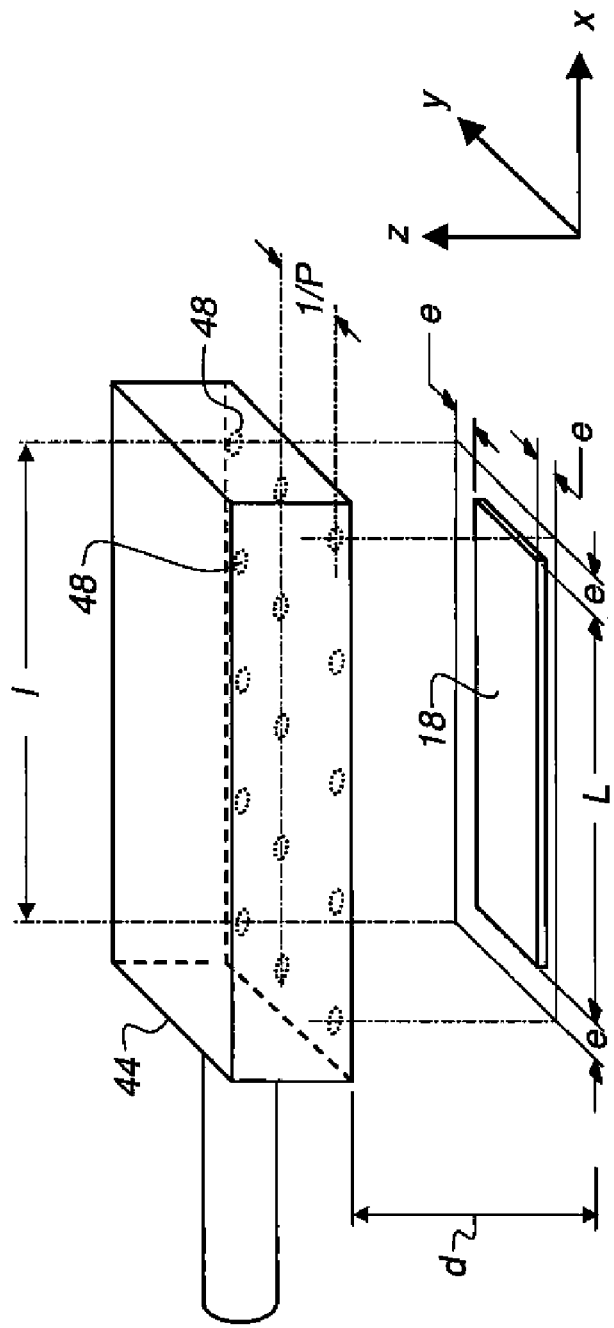
FIG. 10 is a perspective showing some key dimensions for vapor deposition using the method and apparatus of the present invention.

An example of source-substrate deposition geometry is depicted schematically in FIG. 10. Substrate 18 of lateral dimension L is parallel to a source of lateral dimension l and is positioned a throw distance d away from it. The lateral extent of the source exceeds that of the substrate on each side by an amount e, so that l−L=2e.

The lateral extent of substrate 18 need not be square. It can be rectangular (so that dimensions $L_1$ and $L_2$ would be different values for substrate length and substrate width dimensions, respectively). Alternately, substrate 18 can be elliptical, such as circular. Substrate 18 could be polygonal, including square, rectangular, hexagonal, or other shapes having three or more edges and vertices. Substrate 18 could also be of irregular shape, that is, having some shape that cannot be classed as polygonal or elliptical. Similarly, the source, at distribution member 44, need not be square. It can be rectangular (where $l_1$ and $l_2$ would be respective source length and source width). It can alternately be elliptical such as circular, polygonal, or of irregular shape. In all such cases, the extent by which the source size exceeds the substrate size can be made to be 2e in all directions, thus providing a perimeter zone of width e.

Figure 11:
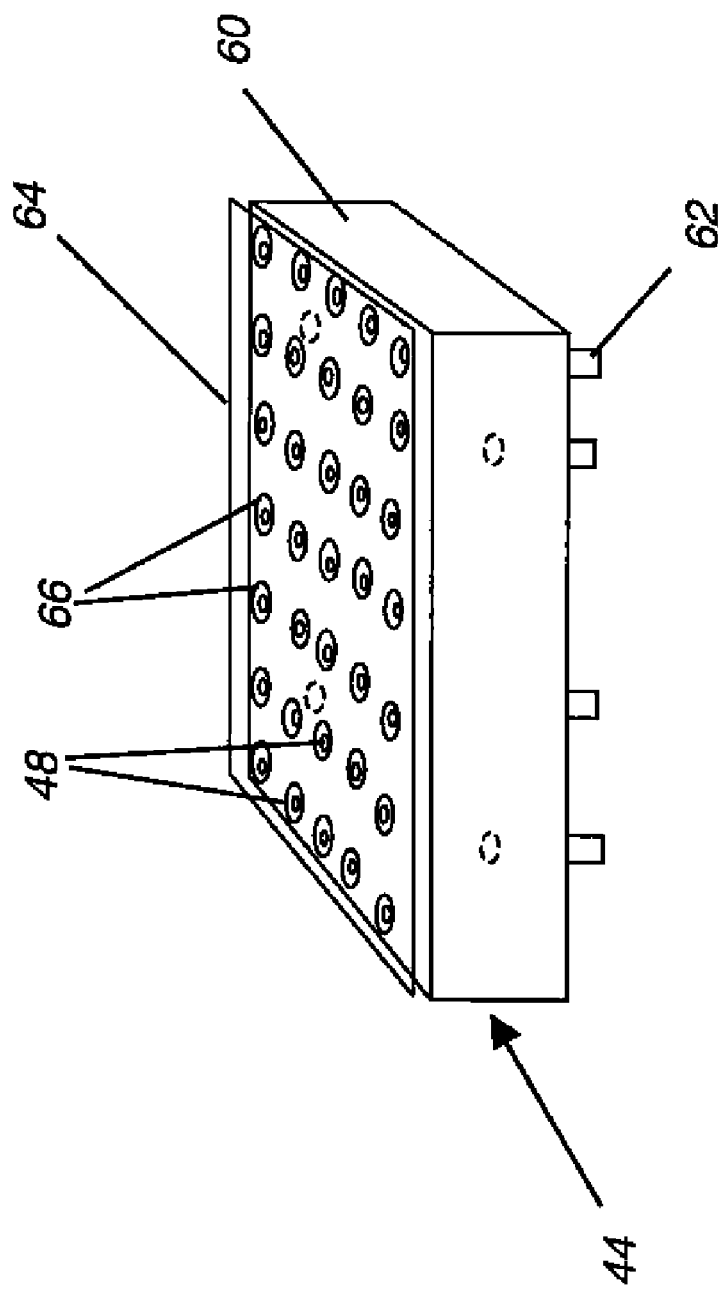
FIG. 11 is a perspective of a distribution member, rotated horizontally from the perspective of FIG. 10 and including a radiation shield.

As shown in FIG. 11, distribution member 44, acting as a source, includes a distributor chamber 60, a polygonal array of apertures 48 along at least one wall of distributor chamber 60, vapor injection ducts 62, and a radiation shield 64 having openings (or apertures) 66. The source extent l is based on the aperture 48 pattern and is not measured from the sides of distributor chamber 60.

For a theoretical array of apertures 48 of infinite extent, the deposition rate profile would be very uniform over any size of substrate 18 at source-substrate spacings significantly larger than the spacing between apertures. In practice, however, the aperture array and substrate are of finite extent, and only in the limit of very small source-substrate spacing d will the deposition rate profile be very uniform. Furthermore, at too small a source-substrate spacing d, the discrete nature of the aperture array causes undulation in the deposition rate profile over the substrate area.

A convenient parameter to express the aperture spacing, one aspect of aperture dimensioning, is the pitch $P_a$, or number of apertures per unit length in a given dimension. The product of $P_a$ and d is important in determining the smallest pitch or smallest source-substrate spacing for avoiding excessive variation in deposition rate profile from the discrete nature of the aperture array. In particular, the product $P_a$ d must be greater than approximately 1 in order to achieve uniformity of better than +/−3%.

In addition to nonuniformity due to the discrete nature of the array of apertures 48, there are more pronounced nonuniformities that are a result of edge effects. Simply put, central areas of substrate 18 receive a distribution from the array of apertures 48 that differs from the distribution that reaches peripheral areas of substrate 18. This edge effect or finite-size effect is one inherent problem that is particularly acute for molecular flow deposition, in which each aperture 48, ideally a point source as described with reference to FIG. 9, acts in analogous fashion to an aperture in an array of light sources. Following this analogy, surface areas exposed to light from near the center of an array of evenly distributed light sources would receive a more uniform light than would surface areas exposed to light from edges of the array of light sources.

Figure 12:
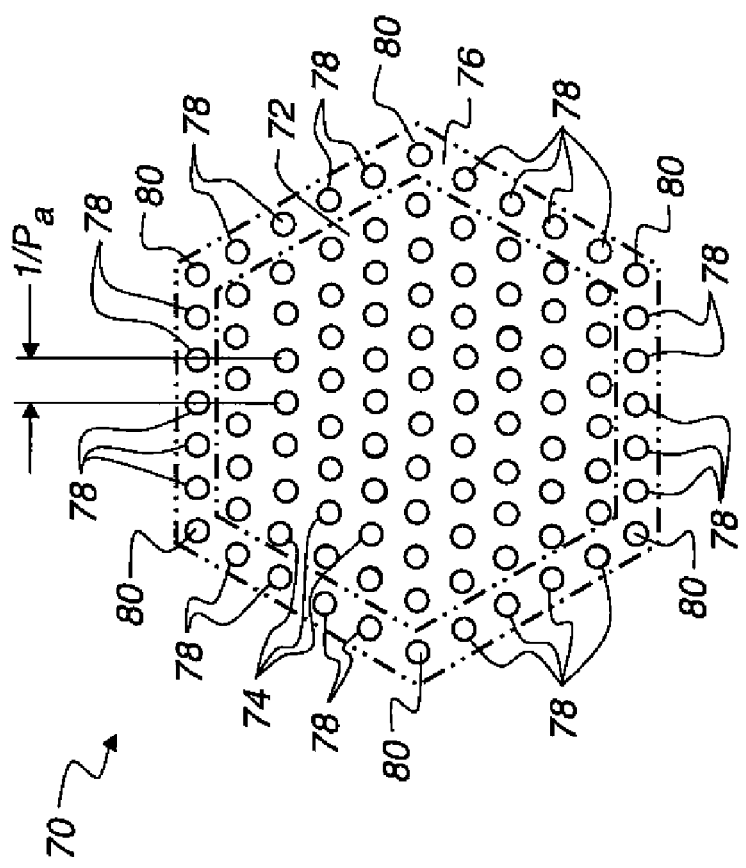
FIGS. 12, 13, and 14 are plan views showing example arrangements for aperture spacing and other dimensioning in different embodiments.
Figure 13:
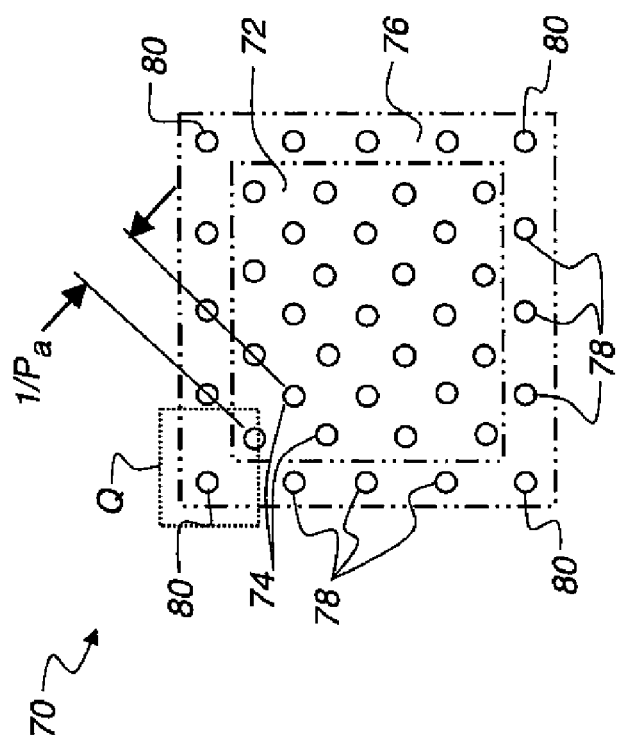
Figure 14:
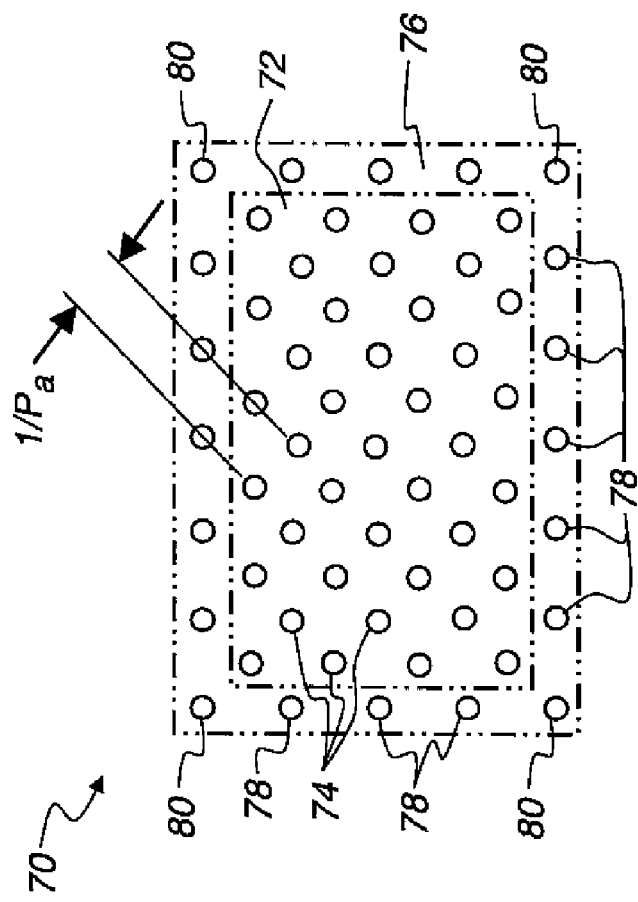

In order to compensate for edge effects of this type, it is necessary to adjust the relative vapor conductance of edge and corner apertures 48 accordingly. The plan views of FIGS. 12, 13 and 14 show example arrangements of apertures 74 that could be used for different embodiments of distribution member 44. In each of these figures, the overall array has a polygonal shape; however, an elliptical shape, such as a circle or an irregular shape (that is, any shape that is neither polygonal nor elliptical) could alternately be used. Taking the example of FIG. 12, a hexagonal pattern of apertures 70 is arranged in regions, bounded by phantom lines. A central region 72 has interior apertures 74 that provide a substantially uniform vapor conductance or flow rate per unit wall area. In one embodiment, apertures 74 are evenly sized and spaced, with an average pitch of $P_a$. A peripheral region 76 has two sets of apertures: edge apertures 78 that define the edge of the polygonal two-dimensional pattern of apertures and corner or vertex apertures 80. By proper dimensioning of the apertures (adjusting either or both aperture diameter and pitch) the vapor conductance-or flow rate per unit wall area of edge and vertex apertures 78 and 80 in peripheral region 76 is greater than the conductance-per-area of interior apertures 74 in central region 72. The conductance per unit wall area is a local measure of emission rate and may be considered from a single aperture and its associated area or from several such apertures in a given localized area. As the pitch and number of apertures used or the aperture conductance itself increases, so does the conductance or flow rate per unit wall area. FIGS. 13 and 14 show other possible arrangements of patterns of apertures 70. For any of these arrangements, the flow rate per unit area of vertex apertures 80 is higher than the flow rate per unit area of edge apertures 78. The flow rate per unit area of edge apertures 78 is, in turn, higher than the flow rate per unit area of interior apertures 74.

Apertures themselves can be configured to provide different flow rates based on their use as interior apertures 74, edge apertures 78, or vertex apertures 80. Other factors in aperture design include cross-sectional outline, which can be polygonal, elliptical, or irregularly shaped.

In the limit of small values for e/L, and values of $d/(d^2+e^2)^{(1/2)}$ sufficiently close to 1, the required vapor conductance enhancement relative to the apertures at the center follows a surprisingly simple scaling relationship with $P_a$ d that can be fit to quadratic order in a log-log plot:

$$\log(C/C_o)=a(\log(P_a d))^2+b(\log(P_a d))+c \quad (4)$$

where $C/C_o$ is the vapor conductance enhancement factor and a, b, and c are respective quadratic, linear, and constant coefficients. Different values of a, b, and c are obtained for corner apertures 80 and edge apertures 78. For both corner apertures 80 and edge apertures 78, the respective values of a, b, and c also depend on the plume shape exponent p. The examples given subsequently show the behavior for plume shape exponents of 1, 2, and 3.

EXAMPLE 1

Plume Shape Exponent p=1

For this example, Equation 3 was used to integrate the contributions from a square array of apertures of lateral extent l on a substrate surface of lateral extent L spaced a distance d therefrom (see FIGS. 10 and 11). The number n of apertures on each edge of length l of the array was specified and thus determined the total number of apertures and the corresponding pitch. The emission strength (intensity) of the four apertures on the corners and the emission strength (intensity) of the apertures on the outer edges (that is, along a line extending between the corner apertures) were specified and are respectively denoted $I_c$ and $I_e$. $I_c$ and $I_e$ are emission strengths relative to the remaining apertures, which are assigned a strength value of unity in these examples. The spatial distribution of deposition rate was determined for the various geometry and emission strength parameters. $I_c$ and $I_e$ and were varied to produce the best deposition uniformity. The plume shape exponent p was also specified as p=1.

For each set of parameters that yielded optimized uniformity, the resultant uniformity over the substrate (having lateral extent L) and utilization were recorded. A variety of substrate sizes, source-substrate spacings, aperture pitch values, and border width values, i.e. e=(l−L)/2, were explored. Generally, the value for e was increased in proportion to the value of d. In some cases, however, it was varied independently. In addition, the pitch value was varied by either changing n—the number of apertures along the edge length of the array—or by changing l—the length of the array, or by changing both n and l.

Figure 17:
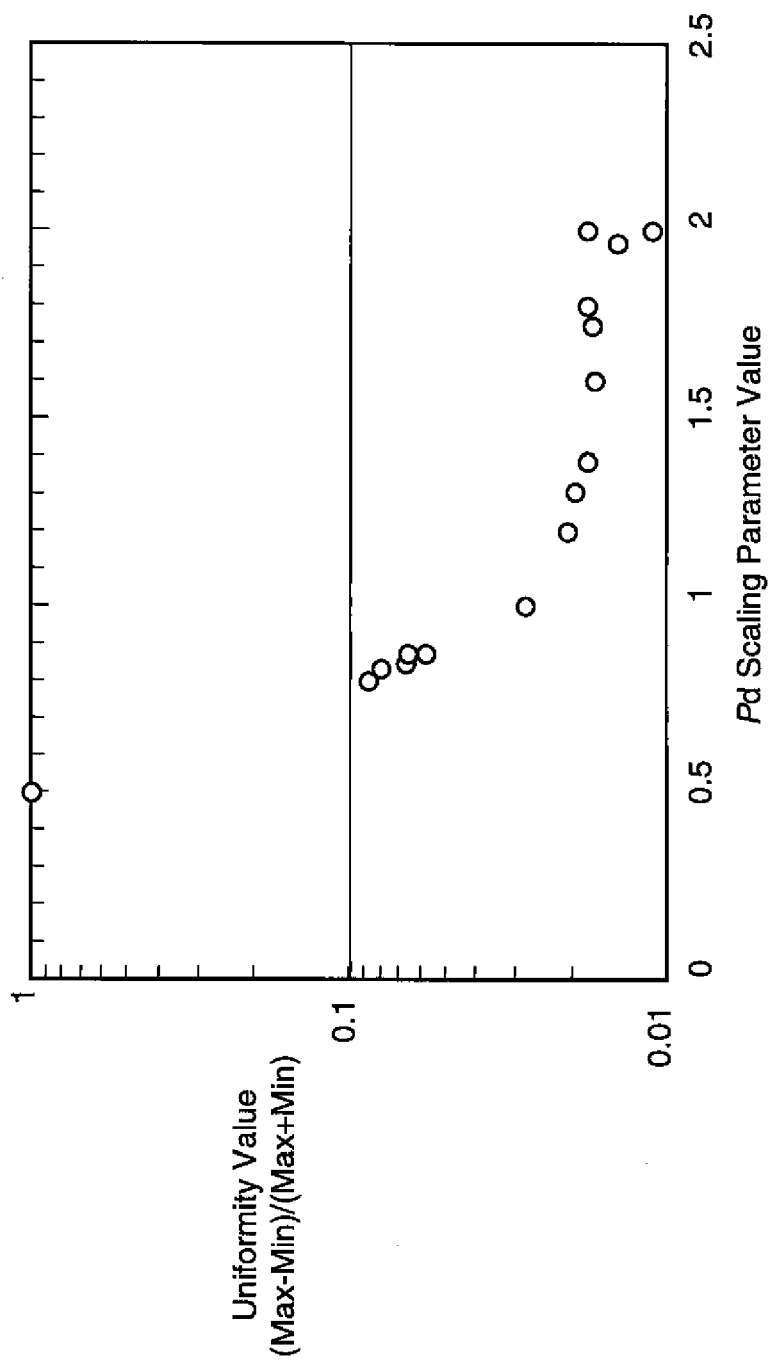
FIG. 17 is a graph showing how the optimized uniformity relates to pitch times throw distance for a plume exponent of 1.

Uniformity and utilization results for a plume shape exponent value of 1 are tabulated in Table I. In FIG. 17, uniformity is plotted against the scaling parameter $P_a$ d. The emission strengths $I_c$ (corner/center) and $I_e$ (edge/center) are plotted against the same scaling parameter in FIGS. 18A and 18B. As can be seen from FIGS. 17, 18A and 18B, the emission strengths required for best uniformity increase with increasing value of $P_a$ d, and the best uniformity is obtained at higher values of $P_a$ d.

The local deposition rate profile was determined near the center of the substrate, in order to find the critical value of n/l (for a given value of substrate-source spacing d) below which the profile had worse than a 3% uniformity value from undulations in the local rate. From these calculations, the critical value of $P_a$ d was found to be approximately 0.97 for a plume shape exponent p value of 1. FIG. 17 illustrates the critical importance of the parameter $P_a$ d but shows somewhat worse uniformity than would be seen at the center of the substrate, as the edge effects have been taken into account.

Figure 19:
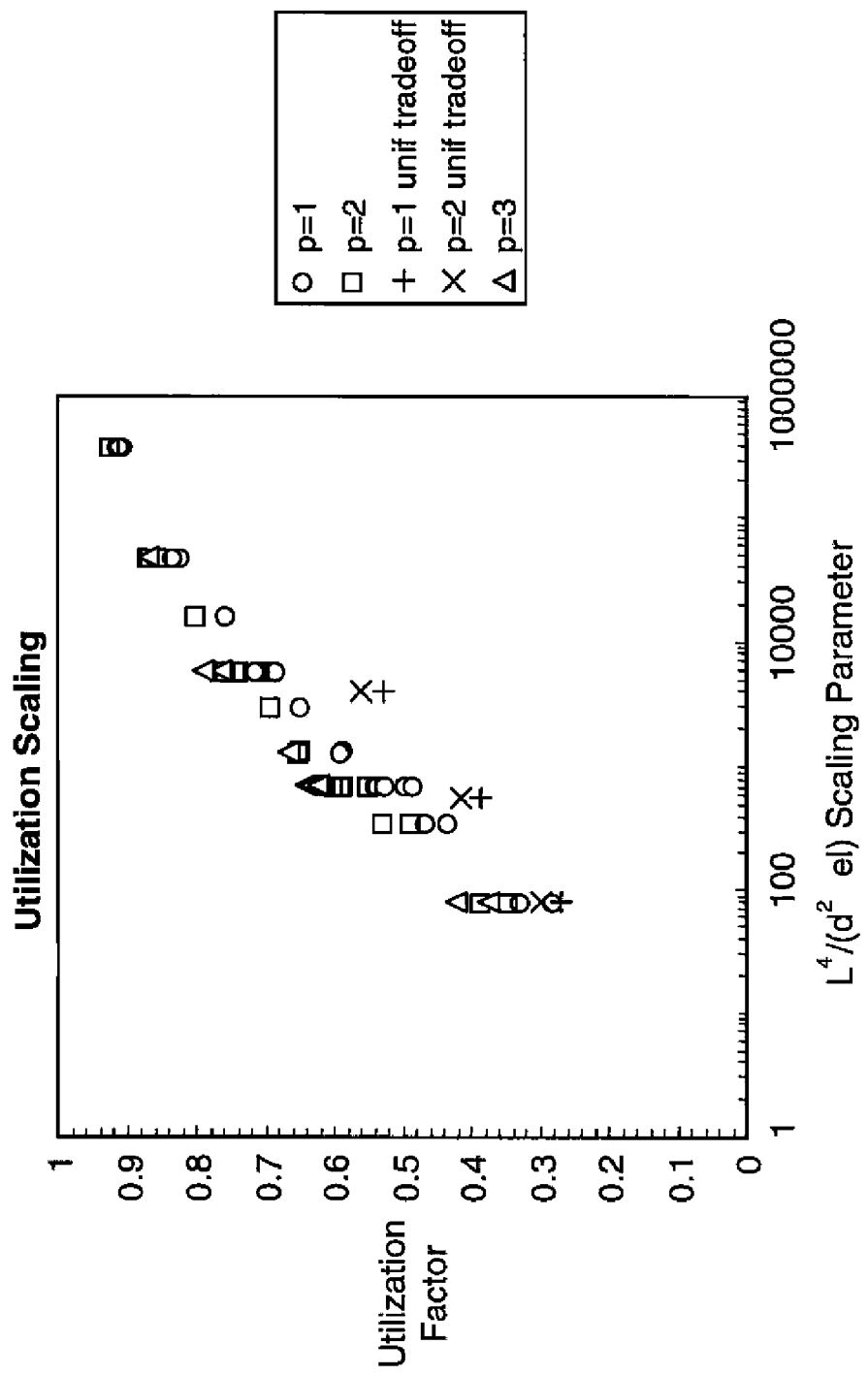
FIG. 19 is a graph showing utilization factor vs. a geometrical scaling parameter for plume exponents of 1, 2, and 3.

The geometrical scaling relationship for utilization is shown in FIG. 19, where the data from Table 1 are plotted against the dimensionless parameter $L^4/(d^2 el)$. From the graph it is clear that better uniformity is obtained for higher values of this parameter.

Figure 18A:
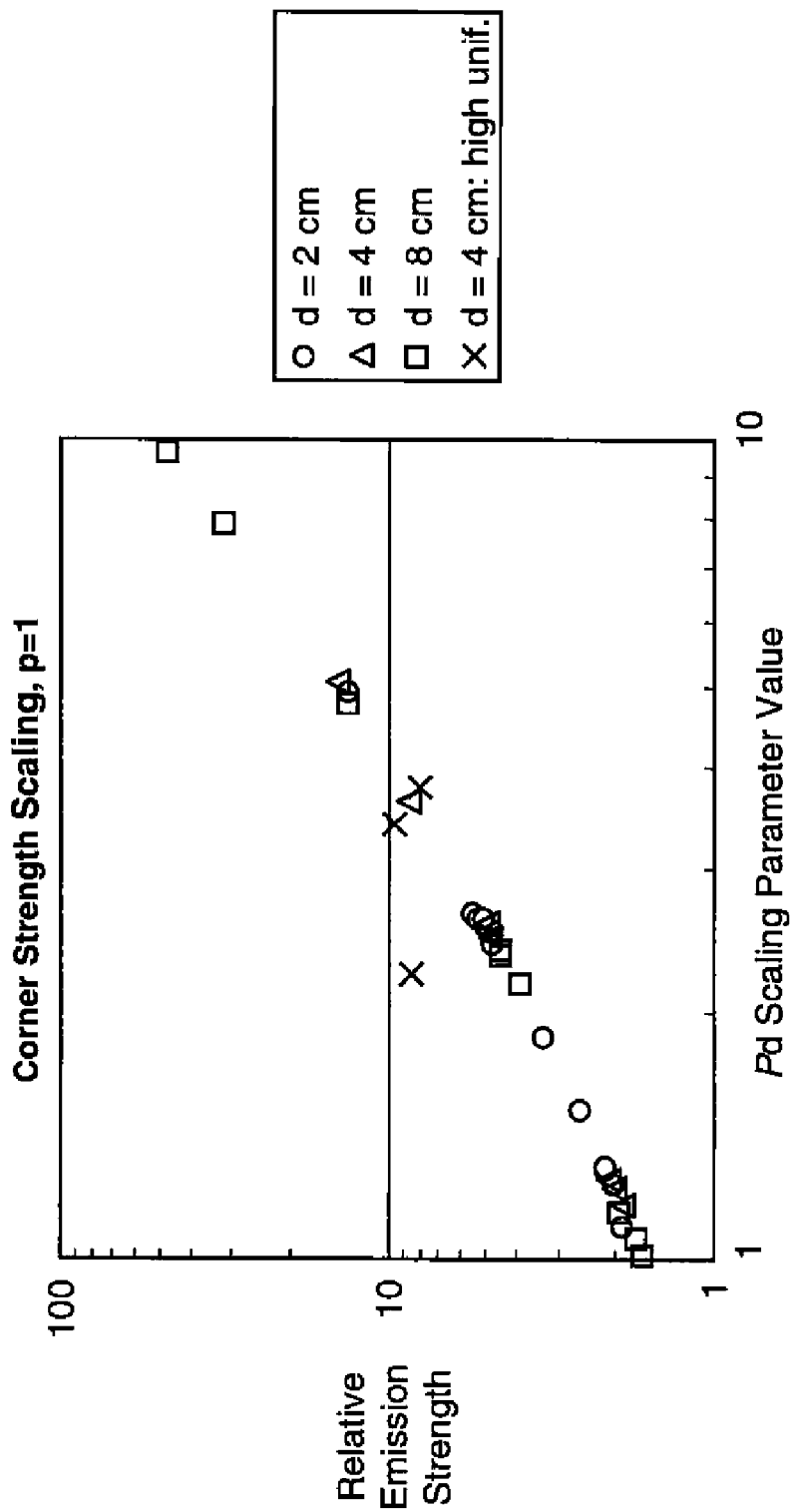
FIG. 18A is a graph showing corner strength scaling with pitch times throw distance for a plume exponent of 1.
Figure 18B:
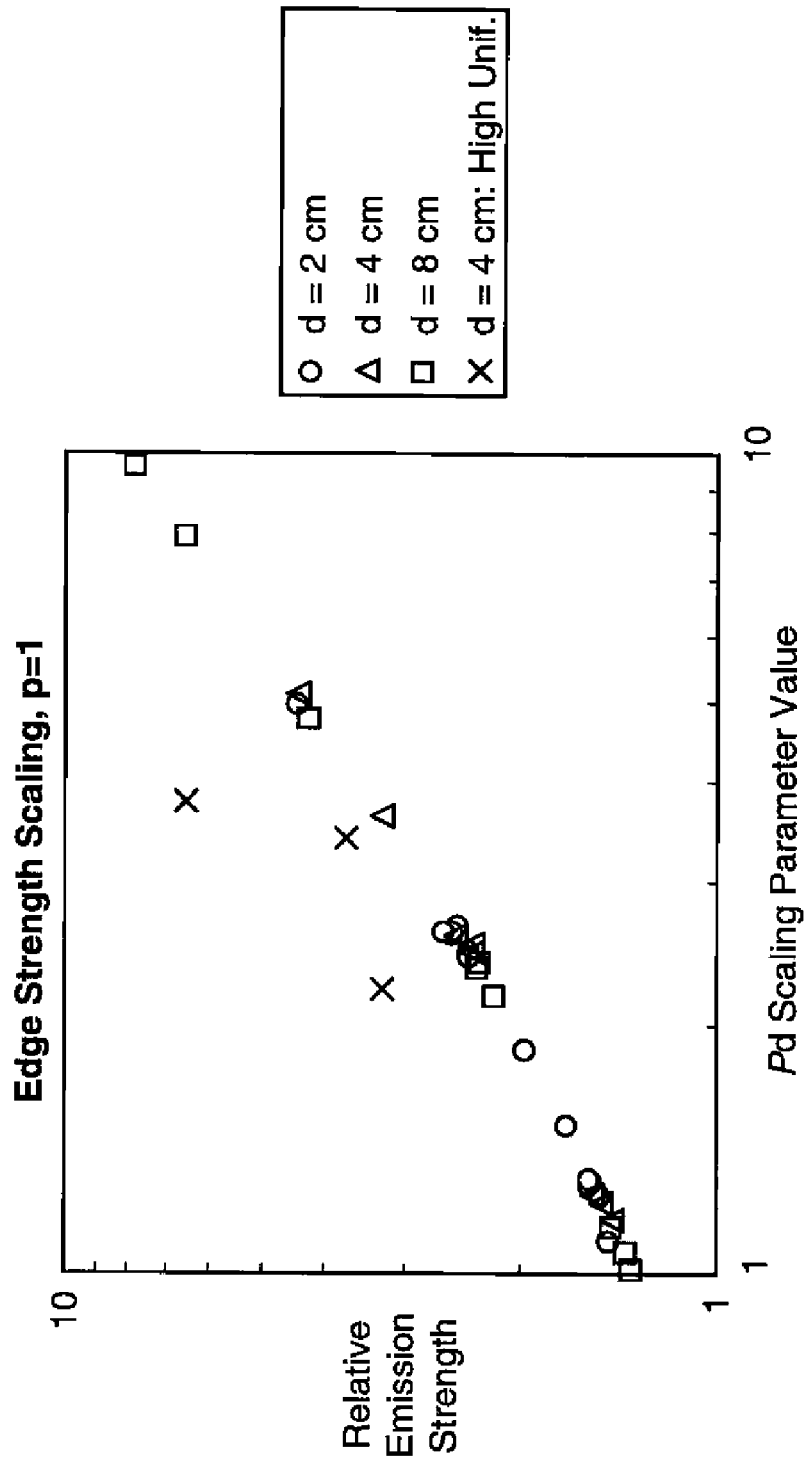
FIG. 18B is a graph showing edge strength scaling with pitch times throw distance for a plume exponent of 1.

The width e of the perimeter or edge zone of enhanced aperture emission can be further increased to improve the uniformity beyond the performance shown in Table 1. Additional data were obtained with increased values of e and are tabulated in Table 2. As can be seen from the table, significantly improved uniformity can be obtained. There is, however, some cost due to poorer utilization. Furthermore, the emission strength may need to increase relative to the scaling relationship in FIGS. 18A and 18B, as the region of enhanced strength becomes increasingly less directed toward the edge of the substrate of length L (this loss of alignment with the substrate edge is expressed by the parameter $d/(d^2+e^2)^{(1/2)}$, which becomes significantly reduced below a value of 1 as the ratio of e/d becomes appreciable). The required corner and edge relative emission strengths for the additional points tabulated in Table 2 are indicated in FIGS. 18A and 18B are. The trade-off in utilization for these points is shown in FIG. 19.

TABLE 1

| L (cm) | d (cm) | l (cm) | # holes on edge | Hole Pitch (#/cm) | e (cm) | p | P · d | $L^4/(d^2el)$ | Corner Center | Edge Center | Unif (+/−) | Utiliz |
|---|---|---|---|---|---|---|---|---|---|---|---|---|
| 10 | 2 | 11.25 | 8 | 0.622 | 0.625 | 1 | 1.244 | 3.56E+02 | 2.02 | 1.5 | 0.0171 | 0.432 |
| 25 | 2 | 26.25 | 18 | 0.648 | 0.625 | 1 | 1.295 | 5.95E+03 | 2.13 | 1.55 | 0.0159 | 0.6922 |
| 50 | 2 | 51.25 | 34 | 0.644 | 0.625 | 1 | 1.288 | 4.88E+04 | 2.15 | 1.57 | 0.0179 | 0.8255 |
| 100 | 2 | 101.25 | 67 | 0.652 | 0.625 | 1 | 1.304 | 3.95E+05 | 2.15 | 1.57 | 0.0196 | 0.905 |
| 10 | 2 | 11.25 | 15 | 1.244 | 0.625 | 1 | 2.489 | 3.56E+02 | 4.7 | 2.4 | 0.0179 | 0.464 |
| 25 | 2 | 26.25 | 36 | 1.333 | 0.625 | 1 | 2.667 | 5.95E+03 | 5.4 | 2.5 | 0.0170 | 0.7074 |
| 50 | 2 | 51.25 | 68 | 1.307 | 0.625 | 1 | 2.615 | 4.88E+04 | 5.2 | 2.53 | 0.0179 | 0.834 |
| 100 | 2 | 101.25 | 134 | 1.314 | 0.625 | 1 | 2.627 | 3.95E+05 | 5.2 | 2.53 | 0.0165 | 0.911 |
| 100 | 2 | 101.25 | 134 | 1.314 | 0.625 | 1 | 2.627 | 3.95E+05 | 5.05 | 2.61 | 0.0162 | 0.91 |
| 15.24 | 2 | 16.41 | 21 | 1.219 | 0.585 | 1 | 2.438 | 1.40E+03 | 4.75 | 2.4 | 0.0195 | 0.5856 |
| 20 | 2 | 21.25 | 21 | 0.941 | 0.625 | 1 | 1.882 | 3.01E+03 | 3.3 | 1.97 | 0.0158 | 0.648 |
| 25 | 2 | 26.25 | 21 | 0.762 | 0.625 | 1 | 1.524 | 5.95E+03 | 2.55 | 1.7 | 0.0151 | 0.696 |
| 35 | 2 | 36.25 | 21 | 0.552 | 0.625 | 1 | 1.103 | 1.66E+04 | 1.9 | 1.46 | 0.0250 | 0.755 |
| 15.24 | 2 | 16.49 | 42 | 2.486 | 0.625 | 1 | 4.973 | 1.31E+03 | 13 | 4.37 | 0.0205 | 0.5909 |
| 25 | 4 | 27.5 | 9 | 0.291 | 1.25 | 1 | 1.164 | 7.10E+02 | 1.9 | 1.44 | 0.0180 | 0.495 |
| 50 | 4 | 52.5 | 17 | 0.305 | 1.25 | 1 | 1.219 | 5.95E+03 | 2.01 | 1.5 | 0.0163 | 0.6875 |
| 100 | 4 | 102.5 | 33 | 0.312 | 1.25 | 1 | 1.249 | 4.88E+04 | 2.1 | 1.55 | 0.0202 | 0.8219 |
| 25 | 4 | 27.5 | 18 | 0.618 | 1.25 | 1 | 2.473 | 7.10E+02 | 4.8 | 2.37 | 0.0171 | 0.5286 |
| 25 | 4 | 27.5 | 36 | 1.273 | 1.25 | 1 | 5.091 | 7.10E+02 | 14.1 | 4.4 | 0.0196 | 0.538 |
| 25 | 4 | 27.5 | 26 | 0.909 | 1.25 | 1 | 3.636 | 7.10E+02 | 8.6 | 3.25 | 0.0182 | 0.5348 |
| 50 | 4 | 52.5 | 34 | 0.629 | 1.25 | 1 | 2.514 | 5.95E+03 | 4.95 | 2.38 | 0.0169 | 0.7069 |
| 100 | 4 | 102.5 | 67 | 0.644 | 1.25 | 1 | 2.576 | 4.88E+04 | 4.95 | 2.52 | 0.0180 | 0.831 |
| 100 | 4 | 102.5 | 134 | 1.298 | 1.25 | 1 | 5.190 | 4.88E+04 | | | 0.0220 | 0.2785 |
| 25 | 8 | 30 | 5 | 0.133 | 2.5 | 1 | 1.067 | 8.14E+01 | 1.73 | 1.38 | 0.0220 | 0.2785 |
| 50 | 8 | 55 | 8 | 0.127 | 2.5 | 1 | 1.018 | 7.10E+02 | 1.66 | 1.35 | 0.0273 | 0.483 |
| 100 | 8 | 105 | 16 | 0.143 | 2.5 | 1 | 1.143 | 5.95E+03 | 1.95 | 1.45 | 0.0196 | 0.684 |
| 25 | 8 | 30 | 10 | 0.300 | 2.5 | 1 | 2.400 | 8.14E+01 | 4.47 | 2.3 | 0.0176 | 0.327 |
| 50 | 8 | 55 | 16 | 0.273 | 2.5 | 1 | 2.182 | 7.10E+02 | 3.9 | 2.2 | 0.0174 | 0.525 |
| 100 | 8 | 105 | 32 | 0.295 | 2.5 | 1 | 2.362 | 5.95E+03 | 4.5 | 2.32 | 0.0164 | 0.705 |
| 100 | 8 | 105 | 64 | 0.600 | 2.5 | 1 | 4.800 | 5.95E+03 | 13 | 4.2 | 0.0188 | 0.71 |
| 100 | 8 | 105 | 128 | 1.210 | 2.5 | 1 | 9.676 | 5.95E+03 | 46.5 | 7.8 | 0.0185 | 0.7126 |
| 100 | 8 | 105 | 105 | 0.990 | 2.5 | 1 | 7.924 | 5.95E+03 | 31.5 | 6.55 | 0.0187 | 0.7118 |

TABLE 2

| L (cm) | d (cm) | l (cm) | # holes on edge | Hole Pitch (#/cm) | e (cm) | p | P · d | $L^4/(d^2 el)$ | Corner Center | Edge Center | Unif (+/−) | Utiliz |
|---|---|---|---|---|---|---|---|---|---|---|---|---|
| 100 | 4 | 125 | 119 | 0.944 | 12.5 | 1 | 3.776 | 4.00E+03 | 8 | 6.5 | 0.0024 | 0.5282 |
| 25 | 4 | 40 | 35 | 0.850 | 7.5 | 1 | 3.400 | 8.14E+01 | 9.5 | 3.7 | 0.0023 | 0.2706 |
| 50 | 4 | 70 | 40 | 0.557 | 10 | 1 | 2.229 | 5.58E+02 | 8.5 | 3.25 | 0.0024 | 0.387 |

EXAMPLE 2

Plume Shape Exponent p=2

Figure 20A:
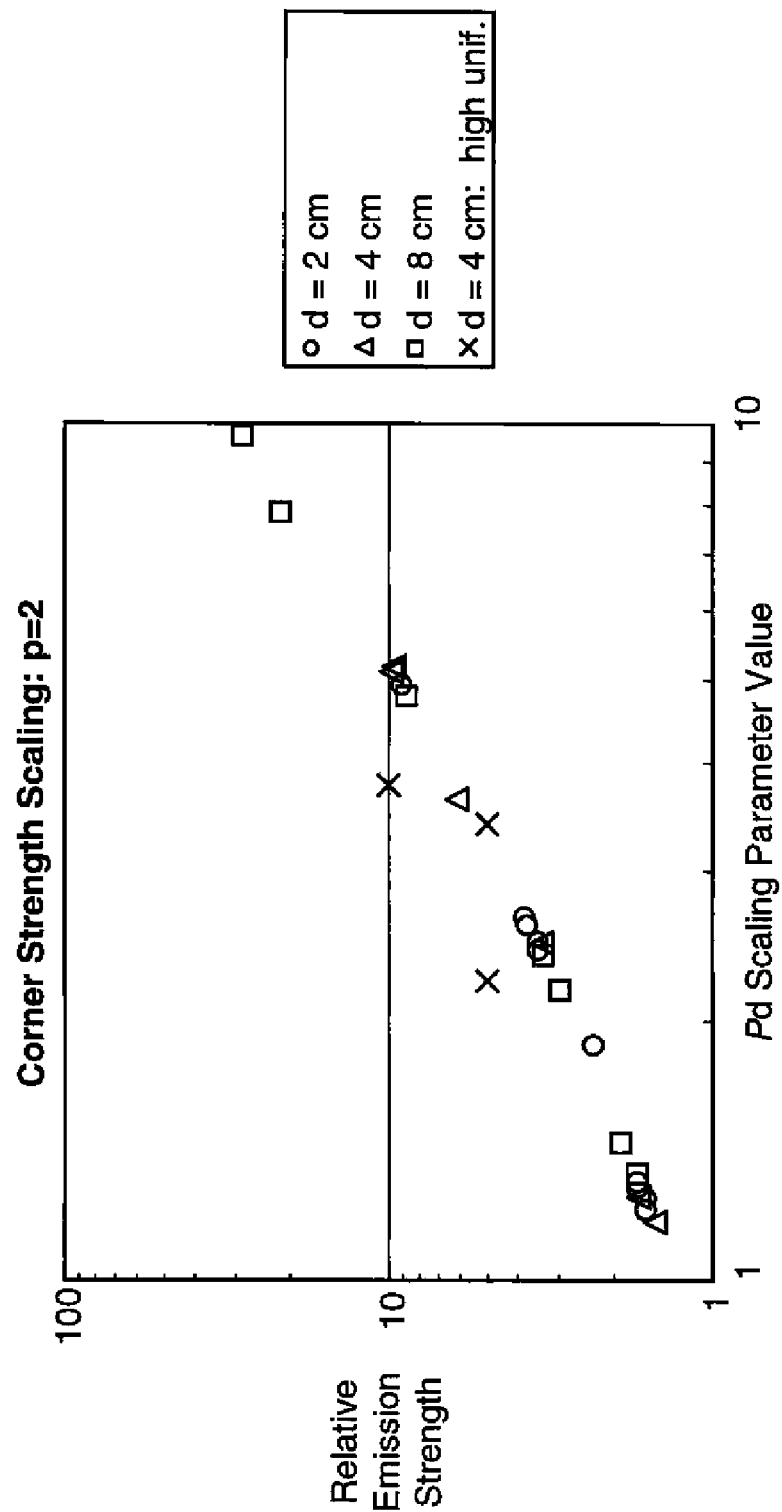
FIG. 20A is a graph showing corner strength scaling with pitch times throw distance for a plume exponent of 2.
Figure 20B:
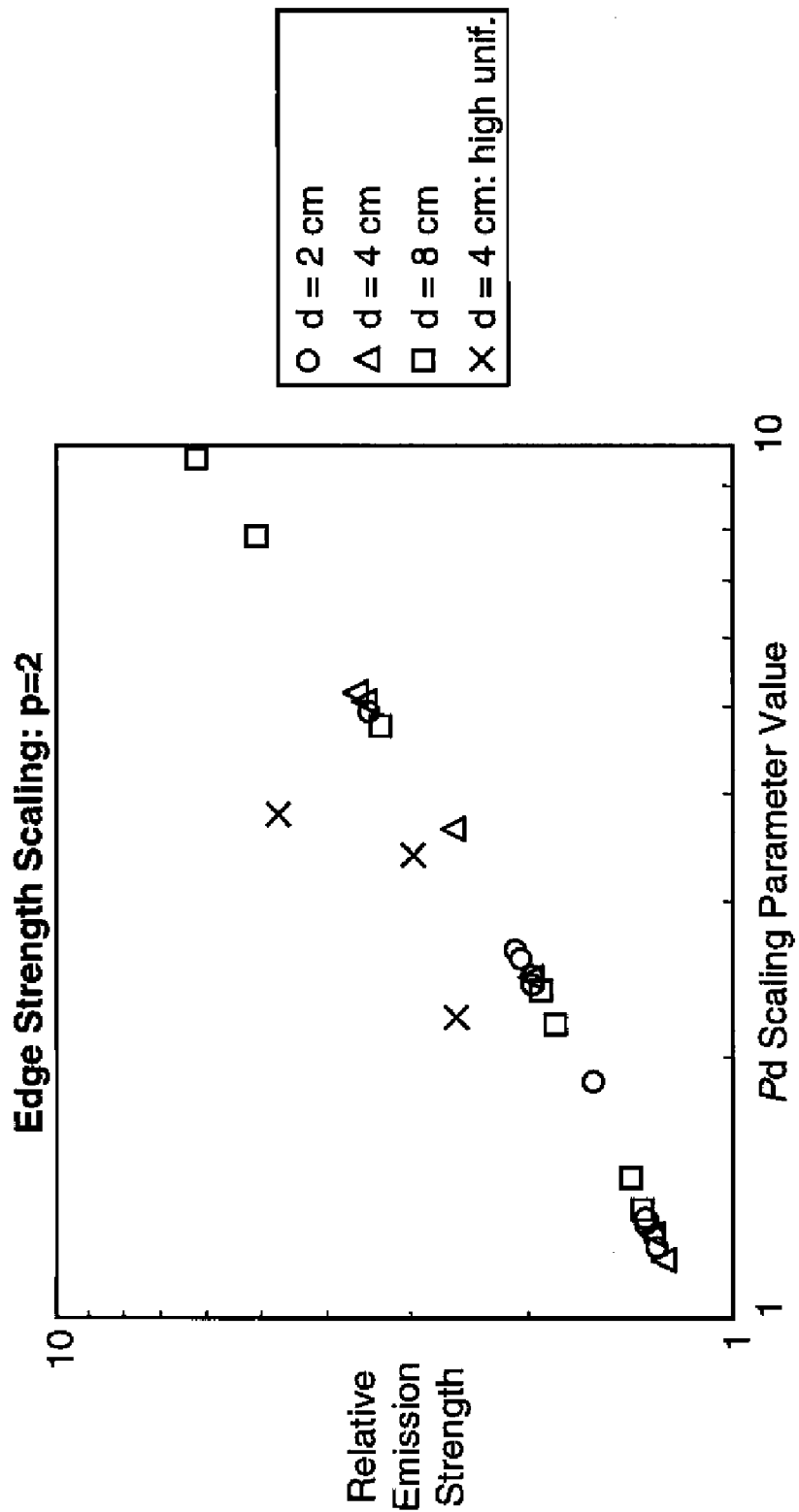
FIG. 20B is a graph showing edge strength scaling with pitch times throw distance for a plume exponent of 2.

As in Example 1, Equation 3 was used to integrate the contributions from a square array of apertures of lateral extent l on a substrate surface of lateral extent L spaced a distance d therefrom. The same parameters were specified and the same calculations were performed using a value of 2 for the plume shape exponent p. In this case, the critical value of $P_a d$ was found to be approximately 1.11 (as in the above example, this critical value is assessed by examining the local uniformity near the center of the substrate, edge effects notwithstanding). The results are tabulated in Table 3. The geometrical scaling relationships for utilization and emission strength for corners and edges are shown in FIGS. 20A and 20B. In addition, points tabulated in Table 4 show how the width e of the perimeter zone of enhanced aperture emission can be further increased to improve the uniformity, but at a cost of utilization (see FIG. 19). Furthermore, the emission strength may need to increase relative to the scaling relationship in FIGS. 20A and 20B, as the region of enhanced strength becomes increasingly less directed toward the edge of the substrate of length L (this loss of alignment with the substrate edge is expressed by the parameter $d/(d^2+e^2)^{(1/2)}$, which becomes significantly reduced below a value of 1 as the ratio of e/d becomes appreciable. The relative corner and edge emission strengths for the points tabulated in Table 4 are indicated in FIGS. 20A and 20B.

Figure 22:
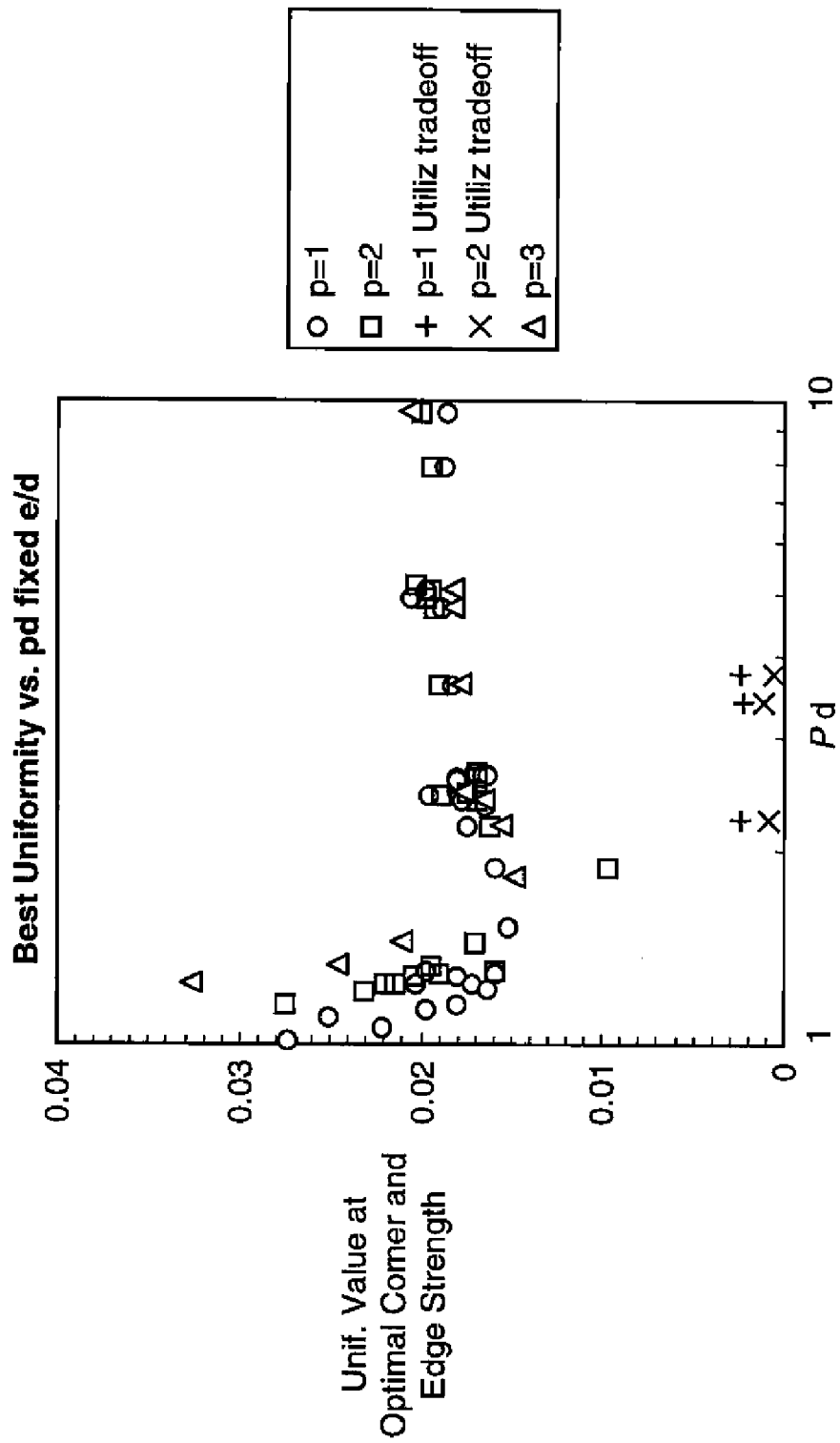
FIG. 22 is a graph showing best uniformity (with optimal corner and edge strength) vs. hole pitch times distance for plume exponents of 1, 2, and 3.

FIG. 22 is a graph showing best uniformity, obtained with optimal corner and edge strength, vs. hole pitch times distance. Results for plume shape exponent p=1, p=2, and p=3 (Example 3 below) are shown.

TABLE 3

| L (cm) | d (cm) | l (cm) | # holes on edge | Hole Pitch (#/cm) | e (cm) | p | P · d | $L^4/(d^2 el)$ | Corner Center | Edge Center | Unif (+/−) | Utiliz |
|---|---|---|---|---|---|---|---|---|---|---|---|---|
| 10 | 2 | 11.25 | 8 | 0.622 | 0.625 | 2 | 1.244 | 3.56E+02 | 1.61 | 1.3 | 0.0218 | 0.4861 |
| 25 | 2 | 26.25 | 18 | 0.648 | 0.625 | 2 | 1.295 | 5.95E+03 | 1.68 | 1.33 | 0.0190 | 0.7377 |
| 50 | 2 | 51.25 | 34 | 0.644 | 0.625 | 2 | 1.288 | 4.88E+04 | 1.68 | 1.34 | 0.0204 | 0.8557 |
| 100 | 2 | 101.25 | 67 | 0.652 | 0.625 | 2 | 1.304 | 3.95E+05 | 1.71 | 1.34 | 0.0159 | 0.9248 |
| 10 | 2 | 11.25 | 15 | 1.244 | 0.625 | 2 | 2.489 | 3.56E+02 | 3.45 | 1.97 | 0.0168 | 0.5269 |
| 25 | 2 | 26.25 | 36 | 1.333 | 0.625 | 2 | 2.667 | 5.95E+03 | 3.8 | 2.08 | 0.0169 | 0.7572 |
| 50 | 2 | 51.25 | 68 | 1.307 | 0.625 | 2 | 2.615 | 4.88E+04 | 3.7 | 2.05 | 0.0168 | 0.8662 |
| 15.24 | 2 | 16.41 | 21 | 1.219 | 0.585 | 2 | 2.438 | 1.40E+03 | 3.43 | 1.97 | 0.0188 | 0.6471 |
| 20 | 2 | 21.25 | 21 | 0.941 | 0.625 | 2 | 1.882 | 3.01E+03 | 2.33 | 1.6 | 0.0096 | 0.6896 |
| 35 | 2 | 36.25 | 23 | 0.607 | 0.625 | 2 | 1.214 | 1.66E+04 | 1.61 | 1.29 | 0.0231 | 0.7999 |
| 15.24 | 2 | 16.49 | 42 | 2.486 | 0.625 | 2 | 4.973 | 1.31E+03 | 9.1 | 3.45 | 0.0197 | 0.6521 |
| 25 | 4 | 27.5 | 9 | 0.291 | 1.25 | 2 | 1.164 | 7.10E+02 | 1.52 | 1.27 | 0.0274 | 0.5483 |
| 100 | 4 | 102.5 | 33 | 0.312 | 1.25 | 2 | 1.249 | 4.88E+04 | 1.7 | 1.31 | 0.0213 | 0.8552 |
| 25 | 4 | 27.5 | 18 | 0.618 | 1.25 | 2 | 2.473 | 7.10E+02 | 3.34 | 1.99 | 0.0174 | 0.5897 |
| 25 | 4 | 27.5 | 36 | 1.273 | 1.25 | 2 | 5.091 | 7.10E+02 | 9.8 | 3.49 | 0.0193 | 0.6013 |
| 25 | 4 | 27.5 | 26 | 0.909 | 1.25 | 2 | 3.636 | 7.10E+02 | 6.1 | 2.58 | 0.0189 | 0.5988 |
| 100 | 4 | 102.5 | 134 | 1.298 | 1.25 | 2 | 5.190 | 4.88E+04 | 9.6 | 3.6 | 0.0202 | 0.868 |
| 25 | 8 | 30 | 6 | 0.167 | 2.5 | 2 | 1.333 | 8.14E+01 | 1.69 | 1.35 | 0.0194 | 0.3463 |
| 100 | 8 | 105 | 20 | 0.181 | 2.5 | 2 | 1.448 | 5.95E+03 | 1.9 | 1.41 | 0.0169 | 0.7424 |
| 25 | 8 | 30 | 10 | 0.300 | 2.5 | 2 | 2.400 | 8.14E+01 | 3.27 | 1.91 | 0.0169 | 0.3846 |
| 50 | 8 | 55 | 16 | 0.273 | 2.5 | 2 | 2.182 | 7.10E+02 | 2.9 | 1.81 | 0.0161 | 0.5863 |
| 100 | 8 | 105 | 64 | 0.600 | 2.5 | 2 | 4.800 | 5.95E+03 | 8.8 | 3.3 | 0.0192 | 0.7615 |
| 100 | 8 | 105 | 128 | 1.210 | 2.5 | 2 | 9.676 | 5.95E+03 | 28.4 | 6.2 | 0.0200 | 0.7634 |
| 100 | 8 | 105 | 105 | 0.990 | 2.5 | 2 | 7.924 | 5.95E+03 | 21.5 | 5.05 | 0.0193 | 0.764 |

TABLE 4

| L (cm) | d (cm) | l (cm) | # holes on edge | Hole Pitch (#/cm) | e (cm) | p | P · d | $L^4/(d^2 el)$ | Corner Center | Edge Center | Unif (+/−) | Utiliz |
|---|---|---|---|---|---|---|---|---|---|---|---|---|
| 100 | 4 | 125 | 119 | 0.944 | 12.5 | 2 | 3.776 | 4.00E+03 | 10 | 4.7 | 0.00053 | 0.5585 |
| 25 | 4 | 40 | 35 | 0.850 | 7.5 | 2 | 3.400 | 8.14E+01 | 5 | 2.96 | 0.00118 | 0.2974 |
| 50 | 4 | 70 | 40 | 0.557 | 10 | 2 | 2.229 | 5.58E+02 | 5 | 2.55 | 0.00082 | 0.4162 |

EXAMPLE 3

Plume Shape Exponent p=3

Figure 21A:
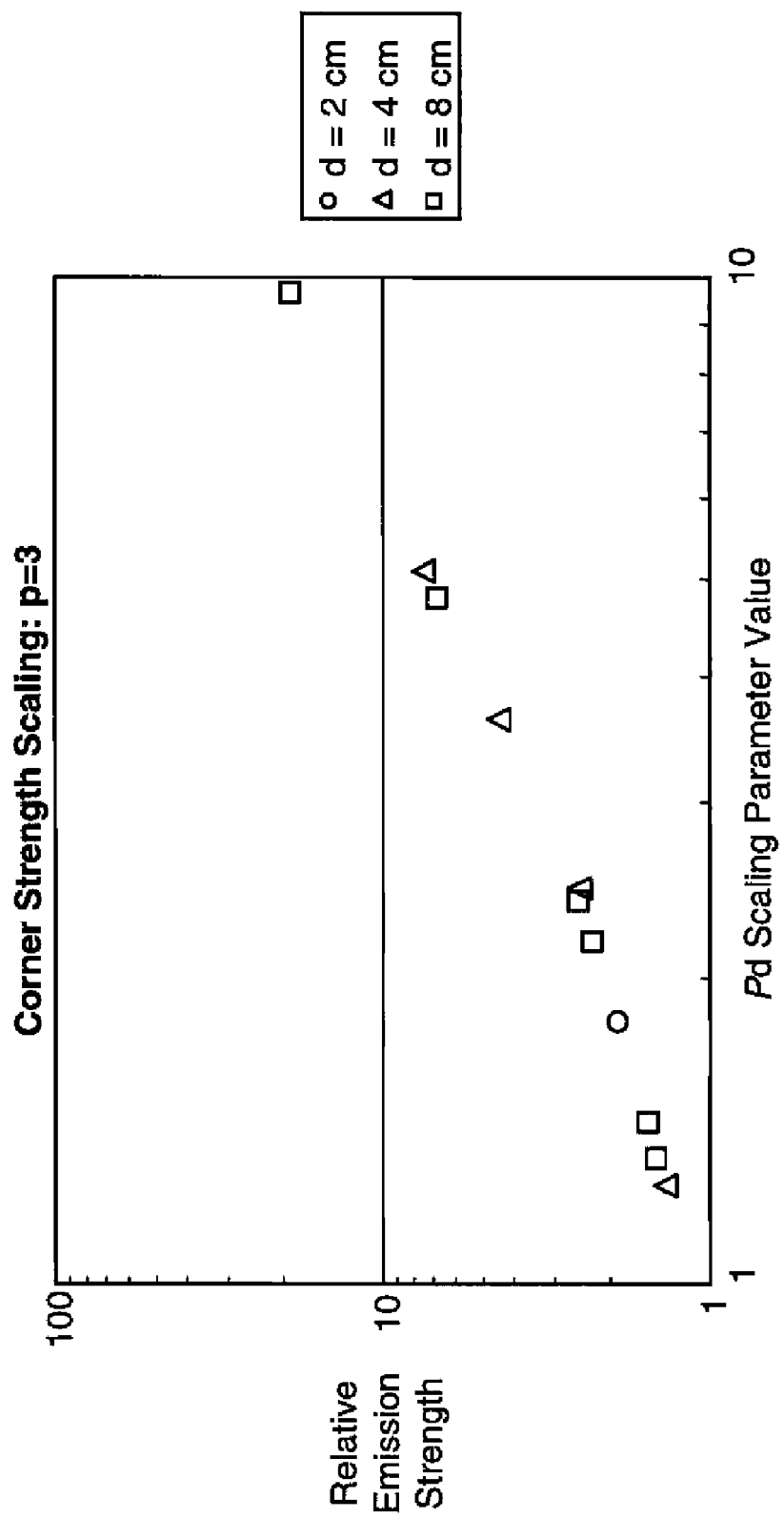
FIG. 21A is a graph showing corner strength scaling with pitch times throw distance for a plume exponent of 3.

As in Example 1, Equation 3 was used to integrate the contributions from a square array of apertures of lateral extent l onto a substrate surface of lateral extent L spaced a distance d therefrom. The same parameters were specified and the same calculations were performed using a value of 3 for the plume shape exponent p. In this case, the critical value of $P_a \cdot d$ was found to be approximately 1.22. As in the earlier examples, this critical value is assessed by examining the local uniformity near the center of the substrate, edge effects not withstanding). The results of the calculations are tabulated in Table 5. The geometrical scaling relationships for utilization and emission strength for corners and edges are shown in FIGS. 21A and 21B.

TABLE 5

| L (cm) | d (cm) | l (cm) | # holes on edge | Hole Pitch (#/cm) | e (cm) | p | P·d | $L^4/(d^2el)$ | Corner Center | Edge Center | Unif (+/−) | Utiliz |
|---|---|---|---|---|---|---|---|---|---|---|---|---|
| 15.24 | 2 | 16.49 | 16 | 0.910 | 0.625 | 3 | 1.819 | 1.31E+03 | 1.9 | 1.43 | 0.0148 | 0.6654 |
| 100 | 4 | 102.5 | 33 | 0.312 | 1.25 | 3 | 1.249 | 4.88E+04 | 1.36 | 1.22 | 0.0326 | 0.8687 |
| 25 | 4 | 27.5 | 18 | 0.618 | 1.25 | 3 | 2.473 | 7.10E+02 | 2.51 | 1.76 | 0.0177 | 0.6243 |
| 25 | 4 | 27.5 | 36 | 1.273 | 1.25 | 3 | 5.091 | 7.10E+02 | 7.5 | 2.9 | 0.0183 | 0.639 |
| 25 | 4 | 27.5 | 26 | 0.909 | 1.25 | 3 | 3.636 | 7.10E+02 | 4.4 | 2.26 | 0.0178 | 0.6341 |
| 25 | 8 | 30 | 6 | 0.167 | 2.5 | 3 | 1.333 | 8.14E+01 | 1.45 | 1.23 | 0.0246 | 0.3749 |
| 100 | 8 | 105 | 20 | 0.181 | 2.5 | 3 | 1.448 | 5.95E+03 | 1.53 | 1.3 | 0.021 | 0.7649 |
| 25 | 8 | 30 | 10 | 0.300 | 2.5 | 3 | 2.400 | 8.14E+01 | 2.5 | 1.7 | 0.0166 | 0.4209 |
| 50 | 8 | 55 | 16 | 0.273 | 2.5 | 3 | 2.182 | 7.10E+02 | 2.29 | 1.6 | 0.0155 | 0.6206 |
| 100 | 8 | 105 | 64 | 0.600 | 2.5 | 3 | 4.800 | 5.95E+03 | 6.8 | 2.77 | 0.0183 | 0.7893 |
| 100 | 8 | 105 | 128 | 1.210 | 2.5 | 3 | 9.676 | 5.95E+03 | 19 | 5.2 | 0.0206 | 0.79 |

For each of the above examples, the corner and edge strengths can be fit to a simple polynomial as described in Eq. 4. The fitting parameters a, b, and c are tabulated in Table 6 for the optimal corner and edge strengths and for plume shape exponents of 1, 2, and 3. The logarithms taken (Eq. 4) are in base 10.

TABLE 6

| | Corner Emission Strength Ratio Fit Parameters | | | Edge Emission Strength Ratio Fit Parameters | | |
|---|---|---|---|---|---|---|
| P | a | b | c | a | b | c |
| 1 | 0.512 | 0.961 | 0.219 | 0.229 | 0.581 | 0.126 |
| 2 | 0.552 | 0.819 | 0.128 | 0.266 | 0.477 | 0.067 |
| 3 | 0.486 | 0.794 | 0.043 | 0.309 | 0.378 | 0.043 |

Figure 15:
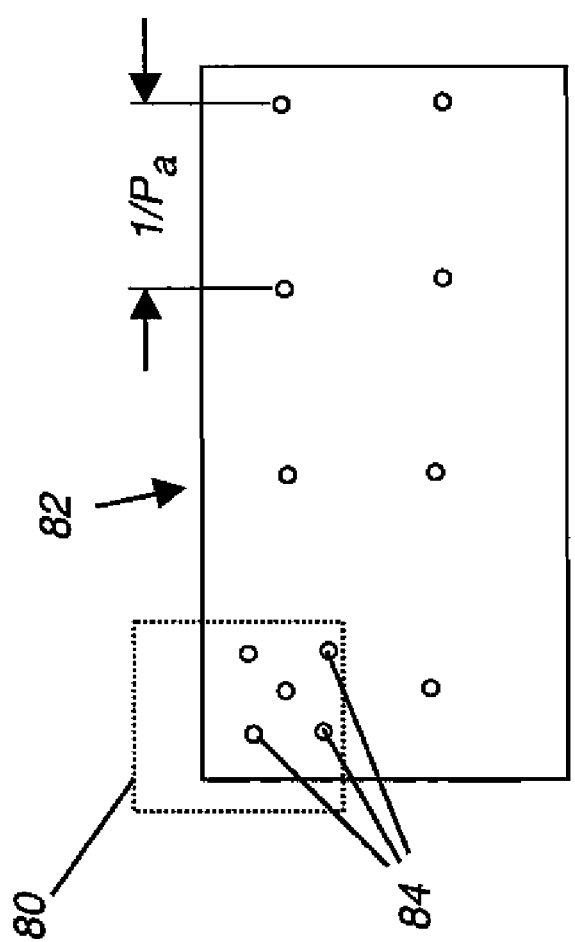
FIG. 15 is a plan view showing a portion of another arrangement for apertures on a distribution member.

As FIGS. 12 through 14 show, there can be any number of possible arrangements of pattern of apertures 70. The vapor conductance of apertures 74, 78, and 80 can be adjusted by any of the following:

(i) dimension, such as by widening apertures 78 and 80 relative to the width of aperture 74 in central region 72, or reducing their length relative to those in the central region;

(ii) spacing, such as shown in FIG. 15.

FIG. 15 shows a pattern of apertures 82 for a section of distribution member 44, such as section Q outlined in FIG. 13. Here, instead of changing the dimensions for a corner aperture 80, apertures 84 that are grouped as a set of apertures to form vertex aperture 80 are spaced more closely together to provide increased vapor conductance at the corner of the aperture array. Also, in FIG. 15, the central array is a square pattern aligned parallel to the perimeter of the array, whereas FIG. 13 shows a square pattern rotated 45° with respect to the perimeter of the array.

For cases where the aperture lateral dimension (e.g., diameter for a round hole aperture 48) is substantially greater than its length, the conductance enhancement factor is given by the ratio of aperture areas. For short ducts, however, aperture vapor conductance scales as $\alpha A$ (e.g., $\alpha\pi r^2$ for a round hole with radius r) where $\alpha$ and A are respectively the transmission probability and area of the aperture. Thus, the vapor conductance enhancement factor of equation (4) can be given by $\alpha A/\alpha_o A_o$. In the limit of long ducts (generally, where $l/(2r) >> 1$), the transmission probability scales as r/l and the vapor conductance ratio becomes $(r/l)^3/(r_o/l_o)^3$. Thus, conductance enhancement factors can be expected to scale as $(r/l)^s/(r_o/l_o)^s$, where $2 \leq s \leq 3$.

Utilization/Uniformity Tradeoff Considerations

It has been observed that improved uniformity often comes at the cost of higher waste, that is, lower utilization. Although it has been recognized that there is at least some coarse relationship between utilization percentage and uniformity, only the most general guidelines for decision-making have been posited in conventional practice. The method of the present invention advantageously provides a way to calculate and balance the somewhat conflicting requirements of utilization and uniformity.

Given a square substrate 18, the materials utilization u for distribution member 44 of the present invention follows a relatively straightforward scaling relationship as shown in FIG. 19:

$$u = f\{L^4/(d^2el)\} \quad (5)$$

where:

f is a monotonically increasing function;

d is the vertical distance ("throw distance") between the surface or wall of distribution member 44 that has apertures 48 and the surface of substrate 18;

e is the dimension of the edge zone in the aperture pattern as was described with respect to FIG. 10;

L is the substrate length and width;

l is the source length and width (as defined by the extent of the aperture pattern)

Implications of equation (5) include the following:

(i) to maintain a given utilization, the ratios L/d (or more generally, $L_1/d$ and $L_2/d$ for a rectangular substrate) L/l and L/e must be maintained;

(ii) for given values of L, d, and l, increasing the edge zone e to achieve better uniformity decreases the utilization.

From FIG. 19 it is apparent that values of 1000 or greater for $L^4/(d^2 e l)$ provide utilization factors in excess of 0.5. For a rectangular substrate, this scaling parameter would be $L_1^2 L_2^2/(d^2 e (l_1+l_2)/2)$, where $L_1$ and $L_2$ and $l_1$ and $l_2$ are the major and minor lengths of the rectangular substrate and aperture pattern, respectively. Similar scaling relationships can be anticipated for circular or elliptical substrates, with diameter (D) or major and minor axes ($D_1$ and $D_2$) replacing L or $L_1$ and $L_2$, and aperture pattern diameter D' or average of axes ($D_1'+D_2'$)/2 replacing l or $l_1$ and $l_2$. Thus, it is found from FIG. 19 that for a variety of plume shapes, the parameter $L^4/(d^2 e l)$ (or its analog in rectangular, circular, elliptical, or polygonal geometries with more than 4 sides) should be greater than 100 for a useful materials utilization factor (greater than or approximately equal to 0.3) and preferably greater than 1000 for a materials utilization factor greater than or approximately equal to 0.5.

For uniformity of approximately +/−3% or better, $P_a$ d values of greater than or approximately equal to 1 are required. A higher degree of uniformity requires $P_a$ d values in excess of 1.2. Still further uniformity improvements can be gained by increasing e to achieve uniformities of better than +/−1%, as shown in Examples 1 and 2. Furthermore, such high uniformities are more readily obtained for higher values of p (i.e., more directed plumes, such as can be achieved by increasing the length to diameter ratio for the apertures in the array). One reference for the relationship of plume shape to molecular flow can be found in *A User's Guide to Vacuum Technology*, by John F. O'Hanlon, John Wiley & Sons, N.Y., 1989, Chapter 3.

Radiation Shield

One known disadvantage of working in the viscous flow regime relates to thermal conductivity. A carrier gas, applied under some pressure from a heated showerhead, acts as a thermal conductor, heating the substrate. In addition to conducting heat from the showerhead, the hot carrier gas delivers heat directly to the substrate. As the carrier gas is often at much higher partial pressure than the material being deposited, the heat it carries can also present an unwanted heat load to the substrate. Vapor deposition in the molecular flow regime used by the method of the present invention, however, does not provide the same thermal behavior. The dominant heat loads are the heat of condensation of the evaporant or sublimate being deposited and thermal radiation from the showerhead. At close spacing between showerhead and substrate these contributions can be significantly less than the heat load by thermal conduction from the carrier gas. Thus, working in the molecular flow regime inherently provides favorable thermal characteristics where substrate heating is a concern, for example when crystallization of the depositing film must be avoided, when substrate-mask alignment must be maintained to high precision, and when the substrate is thermally sensitive (e.g., an organic polymer substrate).

Figure 16:
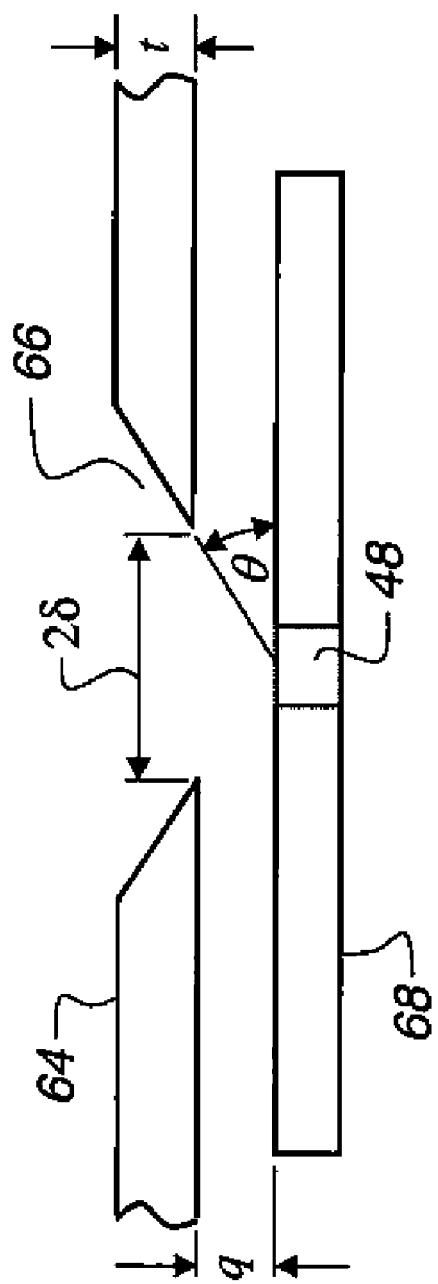
FIG. 16 is a side view showing a single aperture and including a heat shield.

Additional relief from thermal loading can be added to distribution member 44. FIG. 11 showed the deployment of an optional radiation shield 64 mounted as part of distribution member 44, between apertures 48 and substrate 18. Radiation shield 64 has an arrangement of apertures 66 in line with apertures 48. Referring to the enlarged cross-sectional side view of FIG. 16, the arrangement of one aperture 66 of radiation shield 64 relative to aperture 48 on exit wall 68 of distribution member 44 is shown. Aperture 48 of distribution member 44 emits vapor over angle θ, which is a function of the radius and depth of aperture 48 as described above. Aperture 66 in radiation shield 64 is suitably sized to have radius δ that allows emission at angle θ. Thickness t of radiation shield 64 is sized sufficiently so that radiation shield 64 is stable under heated conditions.

The use of optional radiation shield 64 is advantageous for reducing thermal radiation from exit wall 68 onto substrate 18. By reducing the amount radiated heat reaching the substrate from the exit wall, radiation shield 64 helps to reduce the need for supplemental cooling elements for substrate 18, as is needed with other types of deposition apparatus.

Summary

The method of the present invention is capable of optimizing the uniformity of vapor deposition, achieving uniformity of within +/−3% or better. By creating a perimeter zone (of width e) of enhanced conductance in a 2-dimensional aperture array, edge effects that otherwise adversely affect uniformity can be largely mitigated. Uniformity of +/−1% or better can be achieved by increasing the parameters P d and e (respectively, the product of aperture pitch and throw distance and the extent of the perimeter zone of enhanced conductance). This improved uniformity is gained at some loss of materials utilization. The enhanced conductances in the perimeter zone of the aperture array can be selected for best uniformity based on a simple scaling relationship with the parameter P d, while the geometrical parameters for best utilization can be selected from a simple scaling relationship with the parameter $L^4/(d^2 e l)$ or its analogous expression in rectangular, circular, elliptical, or polygonal geometry.

One advantageous effect of the method of the present invention relates to patterning precision, as was described earlier in the background section with reference to FIGS. 2A-2D. By operating in the molecular flow regime rather than in viscous flow, the method of the present invention is capable of achieving surface features having sidewalls that are more nearly vertical than with conventional deposition solutions using a carrier gas. This allows clearer definition and distinction between surface features, enabling further miniaturization of components.

One further advantage of the method of the present invention over conventional methods relates to the absence of carrier gas. Any introduction of additional materials, even inert materials such as an inert carrier gas, comes at a price. With carrier gas as a component at significant partial pressures, some amount of impurity can be introduced into the vaporized material/carrier gas mixture. Some impurities can react with the vaporized material and may incorporate into the depositing film, thereby compromising film performance.

Thus, what is provided is an apparatus and method for providing vapor deposition of a material in the molecular flow regime with optimized utilization and uniformity.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

PARTS LIST

10 Deposition apparatus
12 Vaporization chamber
14 Carrier gas
16 Showerhead
18 Substrate
20 Deposition chamber 22 Surface feature
24 Sidewall
26 Sloped section
30 Mask
36 Viscous flow regime
38 Molecular flow regime
40 Vapor deposition apparatus
42 Heater
44 Distribution member
46 Deposition vessel
48 Aperture
50 Substrate holder
52 Duct
54 Plume
56 Orifice
58 Boundary layer
60 Distributor chamber
62 Vapor injection duct
64 Radiation shield
66 Aperture
68 Exit wall
70 Pattern of apertures
72 Central region
74 Aperture
76 Peripheral region
78 Edge aperture
80 Corner aperture
82 Pattern of apertures
84 Aperture
δ Aperture radius
l Source dimension
L Substrate dimension
d Throw distance
P Pitch
Q Section
θ Angle
q distance
r radial vector
t thickness

The invention claimed is:

1. A method for forming a layer on a substrate surface in making a device, comprising,
   (a) providing a distribution member for receiving vaporized material, the distribution member having one or more walls defining a chamber wherein a polygonal two-dimensional pattern of apertures is formed in a wall, which deliver vaporized material in a plume of molecular flow onto the surface;
   (b) positioning the substrate to be held in a fixed position relative to the distribution member by a substrate holder so that the substrate surface is spaced apart from the distribution member by a throw distance d;
   (c) providing the polygonal two-dimensional pattern of apertures to have at least four vertices, with a first set of apertures disposed at the vertices, a second set of edge apertures disposed between the apertures of the first set and defining the edges of the polygonal two-dimensional pattern, and a third set of interior apertures disposed within the periphery of the polygonal two-dimensional pattern defined by the first and second sets of apertures; and
   (d) dimensioning the first, second, and third set of apertures to obtain a greater flow rate per unit wall area from the first set of apertures than from the second and third set of apertures, and to obtain a greater flow rate per unit wall area from the second set of apertures than from the third set of apertures, by applying the following relationship to the first and second sets of apertures:

$$\log(C/C_o) = a(\log(P_a d))^2 + b(\log(P_a d)) + c$$

wherein $C/C_o$ is the vapor conductance enhancement factor relative to the third set of apertures, $P_a$ is the pitch or number of apertures per unit length in a given dimension, and a, b, and c are respective quadratic, linear, and constant coefficients, such that the values of a, b, and c depend upon the plume shape, different values of a, b, and c are obtained for the first and second sets of apertures, the first set of apertures have quadratic coefficients a in the range of 0.1 to 0.7, b in the range of 0.5 to 1.2, and c in the range of −0.4 to +0.4, and the second set of apertures have quadratic coefficients a in the range of 0.1 to 0.5, b in the range of 0.1 to 0.7, and c in the range of −0.2 to +0.2.

2. The method of claim 1 wherein the first set of apertures include, at least at one vertex, a plurality of apertures spaced more closely together than the other apertures of the array so as to provide increased flow rate per unit wall area at the vertex.

3. The method of claim 1 wherein the step of dimensioning includes sizing aperture diameter.

4. The method of claim 1 wherein the step of dimensioning includes setting the number of apertures.

5. The method of claim 1 wherein the step of dimensioning includes sizing the aperture depth.

6. The method of claim 1 wherein, for at least one edge position, the second set of apertures includes a plurality of apertures.

7. The method of claim 4 further including selecting the number and size of apertures in the wall position.

8. The method of claim 1 wherein the cross-sectional outline of the apertures is polygonal, elliptical, or irregular shapes.

9. The method of claim 1 further comprising:
   (e) distributing apertures in the third set of apertures to have an average pitch $P_a$, such that the product of $P_a$ and d are related as follows:

$$P_a d > 0.8.$$

10. The method of claim 9 wherein the product $$P_a d > 0.97.$$

11. The method of claim 9 wherein the substrate and source are square and the following relationship is satisfied:

$$\frac{L^4}{d^2 el} > 1000$$

wherein L is the width and length of the substrate, l is the width and length of the source, and e is the width of an edge zone satisfying:

$$e = \frac{L-l}{2}.$$

12. The method of claim 11 wherein the following relationship is satisfied:

$$\frac{L^4}{d^2 el} > 1000.$$

13. The method of claim 1 wherein the material is an organic material.

14. The method of claim 1 wherein the distribution member is under vacuum.

15. The method of claim 1 further comprising disposing a radiation shield between the distribution member and the surface.

16. The method of claim 9 wherein the substrate is rectangular and the following relationship is satisfied:

$$\frac{L_1^2 L_2^2}{d^2 e(l_1 + l_2)/2} > 100$$

wherein $L_1$ and $L_2$ are the width and length of the substrate, $l_1$ and $l_2$ are the width and length of the source, and e is the width of an edge zone satisfying:

$$e = \frac{l_1 - L_1}{2} = \frac{l_2 - L_2}{2}.$$

17. The method of claim 16 wherein the following relationship is satisfied:

$$\frac{L_1^2 L_2^2}{d^2 e(l_1 + l_2)/2} > 1000.$$

18. The method of claim 1 wherein the plume has a plume shape exponent of 1, the edge apertures have quadratic coefficients a in the range of 0.15 to 0.3, b in the range of 0.4 to 0.7, and c in the range of 0.05 to 0.15, and the corner apertures have quadratic coefficients a in the range of 0.35 to 0.65, b in the range of 0.7 to 1.2, and c in the range of 0.15 to 0.3.

19. The method of claim 1 wherein the plume has a plume shape exponent of 2, the edge apertures have quadratic coefficients a in the range of 0.2 to 0.35, b in the range of 0.35 to 0.6, and c in the range of 0 to 0.12, and the corner apertures have quadratic coefficients a in the range of 0.4 to 0.7, b in the range of 0.6 to 1.0, and c in the range of 0.06 to 0.2.

20. The method of claim 1 wherein the plume has a plume shape exponent of 3, the edge apertures have quadratic coefficients a in the range of 0.2 to 0.4, b in the range of 0.25 to 0.45, and c in the range of 0 to 0.08, and the corner apertures have quadratic coefficients a in the range of 0.35 to 0.6, b in the range of 0.6 to 1.0, and c in the range of 0 to 0.08.

* * * * *